(12) United States Patent
Bengoechea De La Llera (10) Patent No.: US 12,282,050 B2
(45) Date of Patent: *Apr. 22, 2025

(54) METHOD FOR LOCATING A FAULT POINT ON A HIGH-VOLTAGE THREE-PHASE AC CABLE, AND SYSTEM FOR LOCATING A FAULT POINT

(71) Applicant: LUMIKER APLICACIONES TECNOLOGICAS S.L., Derio (ES)

(72) Inventor: Francisco Javier Bengoechea De La Llera, Derio (ES)

(73) Assignee: LUMIKER APLICACIONES TECNOLOGICAS S.L., Derio (ES)

( * ) Notice: Subject to any disclaimer, the term of this patent is extended or adjusted under 35 U.S.C. 154(b) by 166 days.

This patent is subject to a terminal disclaimer.

(21) Appl. No.: 18/129,351

(22) Filed: Mar. 31, 2023

(65) Prior Publication Data

US 2023/0324450 A1 Oct. 12, 2023

(30) Foreign Application Priority Data

Apr. 6, 2022 (EP) .................................... 22382332

(51) Int. Cl.
*G01R 31/08* (2020.01)
*G01R 19/00* (2006.01)
(Continued)

(52) U.S. Cl.
CPC ....... *G01R 31/083* (2013.01); *G01R 19/0092* (2013.01); *G01R 31/088* (2013.01); *G01R 31/52* (2020.01); *G01R 31/58* (2020.01)

(58) Field of Classification Search
None
See application file for complete search history.

(56) References Cited

U.S. PATENT DOCUMENTS

| 4,721,916 A | * | 1/1988 | Hanasawa | G01R 31/58 324/520 |
| 5,202,812 A | * | 4/1993 | Shinoda | G01R 31/52 361/93.6 |

(Continued)

OTHER PUBLICATIONS

European Search Report, EP22382332, Sep. 20, 2022, 6 pages.
(Continued)

*Primary Examiner* — Jermele M Hollington
(74) *Attorney, Agent, or Firm* — Edell, Shapiro & Finnan, LLC (57) ABSTRACT

A method for locating a fault point (F) in a high-voltage three-phase AC cable (1) with a cross bonding or solid bonded connection system. The method includes determining the conductor (R, S, T) in fault. In the event that the cable (1) includes more than one main section ($MP_1$, $MP_2$, $MP_3$), determining the main section ($MP_1$, $MP_2$, $MP_3$) in fault, and locating the fault point (F) by means of a model of the shields ($S_A$, $S_B$, $S_C$; $S_R$, $S_S$, $S_T$) of the main section ($MP_1$, $MP_2$, $MP_3$) in fault, taking into account that the shields ($S_A$, $S_B$, $S_C$; $S_R$, $S_S$, $S_T$) are attached to one another at the ends of said main part ($MP_1$, $MP_2$, $MP_3$).

14 Claims, 8 Drawing Sheets

(51) Int. Cl.
*G01R 31/52* (2020.01)
*G01R 31/58* (2020.01)

(56) References Cited

U.S. PATENT DOCUMENTS

| | | | | |
|---|---|---|---|---|
| 7,683,798 B2* | 3/2010 | Rostron | ............... | G01R 15/14 |
| | | | | 702/65 |
| 10,852,359 B2* | 12/2020 | Pong | ............... | G01R 31/083 |
| 11,971,440 B2* | 4/2024 | Rajapakse | ............ | G01R 31/085 |
| 2005/0017751 A1* | 1/2005 | Gunn | ............... | G01R 15/142 |
| | | | | 324/764.01 |
| 2021/0072302 A1 | 3/2021 | Frohne et al. | | |
| 2023/0176106 A1* | 6/2023 | Gundel | ............... | G01R 15/16 |
| | | | | 324/538 |
| 2023/0324449 A1* | 10/2023 | Bengoechea De La Llera | ........... | |
| | | | | G01R 19/2513 |
| | | | | 324/522 |

OTHER PUBLICATIONS

Zhou et al., "An integrated Cable Condition Diagnosis and Fault Localization System via Sheath Current Monitoring", 2016 International Conference on Condition Monitoring and Diagnosis, 8 pages.

Li et al., "A Novel Fault Localization Method Based on Monitoring of Sheath Current in a Cross-bonded HV Cable System", 2017 Electrical Insulation Conference, Jun. 14, 2017, IEEE, 4 pages.

Li et al., "A Revised Model for Calculating HV Cable Sheath Current Under Short-Circuit Fault Condition and Its Application for Fault Location—Part 1: The Revised Model", IEEE Transactions on Power Delivery, vol. 34, No. 4, Aug. 2019, 10 pages.

Dong et al., Online Monitoring and Diagnosis of HV Cable Faults by Sheath System Currents, IEEE Transactions on Power Delivery, vol. 32, No. 5, Oct. 2017, 10 pages.

He et al., "Diagnosis and Location of High-voltage Cable Fault Based on Sheath Current", 2018 International Conference on Power System Technology, Nov. 2018, 7 pages.

* cited by examiner

METHOD FOR LOCATING A FAULT POINT ON A HIGH-VOLTAGE THREE-PHASE AC CABLE, AND SYSTEM FOR LOCATING A FAULT POINT

CROSS-REFERENCE TO RELATED APPLICATIONS

This application relates to and claims the benefit and priority to European Application No. EP22382332.9, filed Apr. 4, 2022.

TECHNICAL FIELD

The present invention relates to a method for locating a fault point on a high-voltage three-phase AC cable and to a system for locating a fault point.

BACKGROUND

Methods for detecting a fault on high-voltage three-phase AC cables, i.e., that a short circuit has occurred between a conductor and a shield of said cable, are known.

Methods which, in addition to detecting a fault, locate the point where said fault has occurred, are also known.

For example, U.S. Publication No. 2021/0072302 A1 relates to a method for locating a fault point on a high-voltage cable based on providing at least two current measuring apparatuses arranged at the cable at a given distance and having timers synchronized with one another, and a measuring device for detecting an electric current flowing in the shield and/or an earthing line connecting the shield and earth. The measuring apparatus transmits pairs of current measurement values and associated values of the timer to an analysis unit which, upon the occurrence of a current exceeding a threshold value and/or of a current profile over time that satisfies specific stipulations, feeds to a calculation unit the associated values of the timers and also an indication about the location of the measurement, for which first effects of the short circuit occurred. The calculation unit calculates the location of the fault from the known distance between the measuring apparatuses and a difference between the values of the synchronized timers.

SUMMARY

The object of the invention is to provide a method for locating a fault point on a high-voltage three-phase AC cable, and a system for locating a fault point on a high-voltage three-phase AC cable.

A first aspect of the invention relates to a method for locating a fault point on a high-voltage three-phase AC cable.

The cable in which the method of the invention is applied comprises a first end, a second end, and at least one main section extending between said ends, the cable comprising one conductor per phase and three shields associated with said conductor, said shields being attached to one another and connected to ground at both ends of each main section. Therefore, the method of the invention is configured for being applied in cables with cross bonding connection systems of the shields and in cables with solid bonded connection systems.

The method comprises the following steps:
measuring the conductor current circulating through each conductor both at the first end and at the second end of the cable,
measuring the shield currents in the vicinity of the connection points to ground of the shields,
determining the conductor in fault based on the previously measured conductor currents,
in the event that the cable comprises more than one main section, determining the main section in fault based on the previously measured shield currents, and
locating the fault point by means of a model, also known as digital twin, of the shields of the main section in fault, taking into account that the shields are attached to one another at the ends of said main part in fault, such that three closed nets in which the sum of voltages is zero are formed in the model, the only unknown being the distance to the fault point.

A second aspect of the invention relates to a system for locating a fault point on a cable such as the one described in the first aspect of the invention, the system comprising:
a first current measuring equipment configured for measuring the conductor current circulating through each conductor both at the first end and at the second end of the cable,
a second current measuring equipment configured for measuring the shield current of each shield in the vicinity of the ground connection points, and
a computer configured for executing the method described in the first aspect of the invention based on the current measurements performed by said current measuring equipment.

The method for locating and the system for locating of the invention offer a rapid solution for locating a fault point on a high-voltage three-phase AC cable, with the result virtually being obtained in real time.

Even though a model of the shields is required for locating the exact fault point, said model is not very sensitive to the type of the terrain in which the cable is arranged, since it affects the different parameters of the shield model in a similar manner, and therefore, the influence thereof is virtually cancelled.

Furthermore, the fault resistance, i.e., the resistance between the conductor in fault and the shield in fault at fault point F, nor is it necessary to know the ground resistance of the connections to ground of the shields.

These and other advantages and features will become apparent in view of the figures and of the detailed description.

DETAILED DESCRIPTION

A first aspect of the invention relates to a method for locating a fault point F on a high-voltage three-phase AC cable 1.

The method of the invention is configured for locating a fault point F on a cable 1 comprising a first end 10, a second end 11, and at least one main section $MP_1$, $MP_2$, $MP_3$ extending between said ends 10, 11. The cable 1 comprises one conductor R, S, T for each phase and three shields $S_A$, $S_B$, $S_C$; $S_R$, $S_S$, $S_T$ associated with said conductors R, S, T. The shields $S_A$, $S_B$, $S_C$; $S_R$, $S_S$, $S_T$ are attached to one another and connected to ground G at both ends of each main section $MP_1$, $MP_2$, $MP_3$, preferably by means of a corresponding grounding device 3, 4. Therefore, the method of the invention is configured for being applied in cables 1 with shield cross bonding connection systems, and in cables with solid bonded connection systems.

As discussed above, fault point F is considered the point where one of the conductors R, S, T, of the cable 1 has electrical contact with the corresponding shield $S_A$, $S_B$, $S_C$; $S_R$, $S_S$, $S_T$, such that a short circuit occurs between said conductor R, S, T and the corresponding shield $S_A$, $S_B$, $S_C$; $S_R$, $S_S$, $S_T$ at said fault point F. Furthermore, in the context of the invention, main section in fault will be considered the main section $MP_1$, $MP_2$, $MP_3$ of cable 1 at which the fault point F is arranged.

The method of the invention comprises the following steps:

measuring the conductor current $I_{R1}$, $I_{S1}$, $I_{T1}$, $I_{R2}$, $I_{S2}$, $I_{T2}$ circulating through each conductor R, S, T both at the first end 10 and at the second end 11 of the cable 1, measuring the shield currents $I_{SA1}$, $I_{SB1}$, $I_{SC1}$, $I_{SA2}$, $I_{SB2}$, $I_{SC2}$, $I_{SA3}$, $I_{SB3}$, $I_{SC3}$, $I_{SA4}$, $I_{SB4}$, $I_{SC4}$; $I_{SR1}$, $I_{SS1}$, $I_{ST1}$; $I_{SR2}$, $I_{SS2}$, $I_{ST2}$ in the vicinity of the connection points to ground G of the shields $S_A$, $S_B$, $S_C$, determining the conductor R, S, T in fault based on the previously measured conductor currents $I_{R1}$, $I_{S1}$, $I_{T1}$, $I_{R2}$, $I_{S2}$, $I_{T2}$, in the event that the cable 1 comprises more than one main section $MP_1$, $MP_2$, $MP_3$, determining the main section $MP_1$, $MP_2$, $MP_3$ in fault based on the previously measured shield currents $I_{SA1}$, $I_{SB1}$, $I_{SC1}$, $I_{SA2}$, $I_{SB2}$, $I_{SC2}$, $I_{SA3}$, $I_{SB3}$, $I_{SC3}$, $I_{SA4}$, $I_{SB4}$, $I_{SC4}$, $I_{SR1}$, $I_{SS1}$, $I_{ST1}$; $I_{SR2}$, $I_{SS2}$, $I_{ST2}$, and locating the fault point F by means of a model of the shields $S_A$, $S_B$, $S_C$; $S_R$, $S_S$, $S_T$ of the main section $MP_1$, $MP_2$, $MP_3$ in fault, taking into account that the shields $S_A$, $S_B$, $S_C$; $S_R$, $S_S$, $S_T$ are attached to one another at the ends of said main section $MP_1$, $MP_2$, $MP_3$ in fault, such that three closed nets in which the sum of voltages is zero are formed in the model, the only unknown being the distance x to the fault point.

Preferably, for determining the conductor R, S, T in fault, the conductor current $I_{R1}$, $I_{S1}$; $I_{T1}$ measured at the first end 10 of the cable 1 for each conductor R, S, T is compared with the conductor current $I_{R2}$; $I_{S2}$; $I_{T2}$ measured at the second end 11 of the cable 1, determining that the conductor R, S, T in fault will be the conductor in which the conductor current $I_{R1}$, $I_{R2}$; $I_{S1}$, $I_{S2}$; $I_{T1}$, $I_{T2}$ at said ends 10, 11 is different.

Preferably, when the cable 1 comprises more than one main section $MP_1$, $MP_2$, $MP_3$, the main section $MP_1$, $MP_2$, $MP_3$ in fault is determined taking into account that at the ends of said main section $MP_1$, $MP_2$, $MP_3$ in fault, the shield currents $I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$ are not in phase.

It should be pointed out that in the case of cables 1 with cross bonding connection systems, although the measurement of shield currents $I_{SA1}$, $I_{SB1}$, $I_{SC1}$, $I_{SA2}$, $I_{SB2}$, $I_{SC2}$ at the ends 10, 11 of the cable 1 is exclusive to the corresponding main section $MP_1$, $MP_3$ (only shield current measurement), usually the measurement of shield currents $I_{SA3}$, $I_{SB3}$, $I_{SC3}$; $I_{SA4}$, $I_{SB4}$, $I_{SC4}$ in the intermediate connections to ground G does not present said separation, since the shields $S_A$, $S_B$, $S_C$ are connected to ground by means of a coaxial cable 30, as shown for example in FIG. 1, said coaxial cable being connected to the corresponding shield $S_A$, $S_B$, $S_C$ of the main sections $MP_1$, $MP_2$, $MP_3$ on both sides of the connection to ground of the shield $S_A$, $S_B$, $S_C$, the measurement of said shield currents $I_{SA3}$, $I_{SB3}$, $I_{SC3}$; $I_{SA4}$, $I_{SB4}$, $I_{SC4}$ being performed in the coaxial cable, and therefore being a measurement that combines the shield current on both sides of the connection to ground of the shield $S_A$, $S_B$, $S_C$. Therefore, when there are no single shield current measurements for all the main sections $MP_1$, $MP_2$, $MP_3$, for determining the main section $MP_1$, $MP_2$, $MP_3$ in fault, the shield currents $I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$ are successively analysed starting from one of the ends 10, 11 of the cable 1 until observing that the shield currents $I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$ are not in phase, determining that the main section $MP_1$, $MP_2$, $MP_3$ in fault will be the main section $MP_1$, $MP_2$, $MP_3$ after the connection point to ground G in which it is detected that said shield currents $I_{SA1}$, $I_{SB1}$, $I_{SC1}$; $I_{SA2}$, $I_{SB2}$, $I_{SC2}$, $I_{SA3}$, $I_{SB3}$, $I_{SC3}$, $I_{SA4}$, $I_{SB4}$, $I_{SC4}$ are not in phase. To analyse whether or not the shield currents $I_{SA1}$, $I_{SB1}$, $I_{SC1}$, $I_{SA2}$, $I_{SB2}$, $I_{SC2}$, $I_{SA3}$, $I_{SB3}$, $I_{SC3}$; $I_{SA4}$, $I_{SB4}$, $I_{SC4}$ are in phase, it can be performed, for example, by observing the positive, negative, and homopolar sequences of said currents, although the person skilled in the art can do this in any other way known in the state of the art. In other possible embodiments, in which in the intermediate points where the shields are grounded, the shield currents referring exclusively to the corresponding main section are measured, the main section in fault will be determined by observing said shield currents and seeing at which point they are out of phase, or alternatively detecting the main part in which for one of the shields the shield current at both ends of the main section in fault is different.

In the case of cables 1 with a cross bonding connection system, each main section $MP_1$, $MP_2$, $MP_3$ comprises three minor sections $mp_1$, $mp_2$, $mp_3$, the method comprising determining the minor section $mp_1$, $mp_2$, $mp_3$ in fault once the main section $MP_1$, $MP_2$, $MP_3$ in fault has been determined.

Preferably, for determining the minor section $mp_1$, $mp_2$, $mp_3$ in fault, first the shield $S_A$, $S_B$, $S_C$ in fault is determined by comparing for each shield $S_A$, $S_B$, $S_C$ the shield current $I_{SA1}$, $I_{SB1}$, $I_{SC1}$; $I_{SA2}$, $I_{SB2}$, $I_{SC2}$, $I_{SA3}$, $I_{SB3}$, $I_{SC3}$; $I_{SA4}$, $I_{SB4}$, $I_{SC4}$ measured at one of the ends of the main part $MP_1$, $MP_2$, $MP_3$ in fault with the shield current $I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$ measured at the other end of the main part $MP_1$, $MP_2$, $MP_3$ in fault, the shield $S_A$, $S_B$, $S_C$ in fault being the shield $S_A$, $S_B$, $S_C$ whose current $I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$ at both ends of the main section $MP_1$, $MP_2$, $MP_3$ in fault is different. The minor section $mp_1$, $mp_2$, $mp_3$ in fault will be the minor section $mp_1$, $mp_2$, $mp_3$ in which the conductor R, S, T in fault and the shield $S_A$, $S_B$, $S_C$ in fault coincide. It should be pointed out that the case of the cables with a cross bonding connection system, the minor part $mp_1$, $mp_2$, $mp_3$ in fault is determined univocally, since the determination of said minor part $mp_1$, $mp_2$, $mp_3$ in fault is performed from the short circuit values, without the need for models or suppositions.

Preferably, in cables 1 with a cross bonding connection system, the model of the shields $S_A$, $S_B$, $S_C$ of main section $MP_1$, $MP_2$, $MP_3$ in fault of each shield $S_A$, $S_B$, $S_C$ comprises per minor section $mp_1$, $mp_2$, $mp_3$ its own resistance $R_{SA}$, $R_{SB}$, $R_{SC}$ and its own self-inductance $L_{SA}$, $L_{SB}$, $L_{SC}$ of the corresponding shield $S_A$, $S_B$, $S_C$, the mutual inductance $M_{SB-SA}$, $M_{SC-SA}$; $M_{SA-SB}$, $M_{SC-SB}$; $M_{SA-SC}$, $M_{SB-SC}$ between said shield $S_A$, $S_B$, $S_C$ and the rest of the shields $S_A$, $S_B$, $S_C$, and the mutual inductance $M_{R-SA}$, $M_{S-SA}$, $M_{T-SA}$; $M_{R-SB}$, $M_{S-SB}$, $M_{T-SB}$; $M_{R-SC}$, $M_{S-SC}$, $M_{T-SC}$ between said shield $S_A$, $S_B$, $S_C$ and the conductors R, S, T.

Preferably, to simplify the calculations needed for locating the fault point F, when defining the model of the shield for each shield $S_A$, $S_B$, $S_C$ the capacitive resistance between said shield and the rest of the shields and the conductors is not taken into account, since in case of fault, as the currents are very high and the frequency is the nominal frequency of the facility, they are completely negligible. In the same way, preferably, the model of shield of each shield $S_A$, $S_B$, $S_C$ does not include the admittance between said shield and the rest of the shields and the conductors, since they are values that contribute nothing in fault situations.

Therefore, preferably the parameters that are considered to define the model of the shield for each shield $S_A$, $S_B$, $S_C$ are the following:
- the resistivity of the shield $R_{SA}$, $R_{SG}$, $R_{SC}$. It is a known but temperature-dependent term. It is possible to improve the algorithm if the operating temperature of the cable 1 at the time of the fault is estimated or known. Direct measurements of said temperature with optical or distributed sensors can help to improve said estimate,
- the self-inductance of the shield $L_{SA}$, $L_{SB}$, $L_{SC}$, and
- the mutual inductance between the shield and the rest of the shields $M_{SB-SA}$, $M_{SC-SA}$; $M_{SA-SB}$, $M_{SC-SB}$; $M_{SA-SC}$, $M_{SB-SC}$ and conductors $M_{R-SA}$, $M_{S-SA}$, $M_{T-SA}$; $M_{R-SB}$, $M_{S-SB}$, $M_{T-SB}$; $M_{R-SC}$, $M_{S-SC}$, $M_{T-SC}$. These impedances can ultimately be considered generators, whose magnitude depends on the currents circulating through the shield $S_A$, $S_B$, $S_C$ or the corresponding conductor R, S, T. This coupling is dependent on geometric considerations of both the cable 1 and of how said cable 1 is deployed throughout the facility, whether resting on the ground or in trefoil, etc.

Determining the parameters of the model can be accomplished through the use of an electromagnetic transients simulator (EMT simulator) which estimates parameters based on the features of the cable 1 (i.e., layers, thickness, material, etc.), the arrangement of said cable 1 (i.e., depth, separation, etc.) and the features of the land where it is disposed. For example, the EMT simulator PSCAD™ manufactured by PSCAD can be used. See pscad.com.

Therefore, preferably, when defining the model of the shields only those parts small as they may be, which contribute significantly within the model due to the high level of short circuit currents, are considered.

As previously discussed, the shields $S_A$, $S_B$, $S_C$ are attached and connected to ground at both ends of each main section $MP_1$, $MP_2$, $MP_3$. For this reason, in the model of the shields $S_A$, $S_B$, $S_C$ of main section $MP_1$, $MP_2$, $MP_3$ in fault the ends of the model corresponding to each shield $S_A$, $S_B$, $S_C$ are attached to one another, such that three nets in which the sum of voltages is zero are formed, the only unknown being the distance x to the fault point F.

Therefore, when the cable 1 in which the method of the invention is applied has a cross bonding configuration, preferably the location of the fault point F is calculated by means of the following equations:

$$V_{SF} = V_{SNF}$$

$$V_{SF} = V_{SF\_mpf} + V_{SF\_mpnf1} + V_{SF\_mpnf2}$$

$$V_{SF_{mpf}} = xI_{SF1}R_{SF_{mpf}} + xjwI_{SF1}L_{SF_{mpf}} + xjwI_{CF1}M_{CF-SF_{mpf}} + xjwI_{CNF1}M_{CNF1-SF_{mpf}} + xjwI_{CNF2}M_{CNF2-SF_{mpf}} + xjwI_{SNF1}M_{SNF1-SF_{mpf}} + xjwI_{SNF2}M_{SNF2-SF_{mpf}}(1-x) I_{SF2}R_{SF_{mpf}} + (1-x)jwI_{SF2}L_{SF_{mpf}} + (1-x)jwI_{CF2} M_{CF-SF_{mpf}} + (1-X)jwI_{CNF1}M_{CNF1-SF_{mpf}} + (1-X) jwI_{CNF2}M_{CNF2-SF_{mpf}} + (1-X)jwI_{SNF1}M_{SNF1-SF_{mpf}} + (1-X)jwI_{SNF2}M_{SNF2-SF_{mpf}}$$

$$V_{SF_{mpnf}} = I_{SF}R_{SF_{mpnf}} + jwI_{SF}L_{SF_{mpnf}} + jwI_{CF}M_{CF-SF_{mpnf}} + jwI_{CNF1}M_{CNF1-SF_{mpnf}} + jwI_{CNF2}M_{CNF2-SF_{mpnf}} + jwI_{SNF1}M_{SNF1-SF_{mpnf}} + jwI_{SNF2}M_{SNF2-SF_{mpnf}}$$

$$V_{SNF} = V_{SNF\_mpf} + V_{SNF\_mpnf1} + V_{SNF\_mpnf2}$$

$$V_{SNF_{mpf}} = xI_{SNF}R_{SNF_{mpf}} + xjwI_{SNF}L_{SNF_{mpf}} + xjwI_{CF1} M_{CF-SNF_{mpf}} + xjwI_{CNF1}M_{CNF1-SNF_{mpf}} + xjwI_{CNF2}M_{CNF2-SNF_{mpf}} + xjwI_{SF1}M_{SF-SNF_{mpf}} + xjwI_{SNF2}M_{SNF2-SNF_{mpf}} + (1-x)I_{SNF}R_{SNF_{mpf}} + (1-x) jwI_{SNF}L_{SNF_{mpf}} + (1-x)jwI_{CF2}M_{CF-SNF_{mpf}} + (1-X) jwI_{CNF1}M_{CNF1-SNF_{mpf}} + (1-X)jwI_{CNF2} M_{CNF2-SNF_{mpf}} + (1-X)jwI_{SF2}M_{SF-SNF_{mpf}} + (1-X) jwI_{SNF2}M_{SNF2-SNF_{mpf}}$$

$$V_{SNF_{mpnf}} = I_{SNF}R_{SNF_{mpnf}} + jwI_{SNF}L_{SNF_{mpnf}} + jwI_{CF} M_{CF-SNF_{mpnf}} + jwI_{CNF1}M_{CNF1-SNF_{mpnf}} + jwI_{CNF2}M_{CNF2-SNF_{mpnf}} + jwI_{SF}M_{SF-SNF_{mpnf}} + jwI_{SNF2}M_{SNF2-SNF_{mpnf}}$$

wherein
- SF=shield in fault,
- SNF=shield that is not in fault,
- SNF1=one of the shields that is not in fault,
- SNF2=the other shield that is not in fault,
- CNF1=one of the conductors that is not in fault,
- CNF2=the other conductor that is not in fault,
- mpf=the minor section in fault,
- mpnf=the minor section that is not in fault,
- $I_{SF1}$=The current of the shield in fault on one side of the fault point,
- $I_{SF2}$=The current of the shield in fault on the other side of the fault point,
- $I_{SF}$=The current circulating through the shield in fault in the section in fault. If the current flows from the first end to the second end, it will be considered positive; in contrast, if it flows from the second end to the first end, it will be considered negative,
- $I_{CF}$=The current circulating through the conductor in fault. If the current flows from the first end to the second end, it will be considered positive; in contrast, if it flows from the second end to the first end, it will be considered negative,
- $I_{CF1}$=The current of the conductor in fault on one side of the fault point, and
- $I_{CF2}$=The current of the conductor in fault on the other side of the fault point.

When the method of the invention is applied in a cable with connection system solid-bonded, the cable 1 comprises a single main section $MP_1$. The model of the shields $S_R$, $S_S$, $S_T$ of each shield $S_R$, $S_S$, $S_T$ comprises its own resistance $R_{SR}$, $R_{SS}$, $R_{ST}$ and self-inductance $L_{SR}$, $L_{SS}$, $L_{ST}$, the mutual inductance $M_{SS-SR}$, $M_{ST-SR}$; $M_{SR-SS}$, $M_{ST-SS}$; $M_{SR-ST}$, $M_{SS-ST}$ between said shield $S_R$, $S_S$, $S_T$ and the rest of the shields $S_R$, $S_S$, $S_T$ and the mutual inductance $M_{R-SR}$, $M_{S-SR}$, $M_{T-SR}$;

$M_{R-SS}$, $M_{S-SS}$, $M_{T-SS}$; $M_{R-ST}$, $M_{S-ST}$, $M_{T-ST}$ between said shield $S_R$, $S_S$, $S_T$ and the conductors R, S, T.

Like in the model of shields of the cable with cross bonding connection system and for the same reasons, preferably, when defining the model of shields of the cable with solid bonded connection system, only those parts, small as they may be, which contribute significantly within the model due to the high level of short circuit currents, are considered.

As previously discussed, the shields $S_R$, $S_S$, $S_T$ are attached and connected to ground at both ends of the main section $MP_1$. For this reason, the ends of the models corresponding to each shield $S_R$, $S_S$, $S_T$ are attached to one another, such that three nets in which the sum of voltages is zero are formed, the only unknown being the distance x to the fault point F.

Therefore, preferably, when the cable 1 in which the method of the invention is applied has a solid bonded configuration, preferably the location of the fault point F is calculated by means of the following equations:

$$V_{SF} = V_{SNF1} = V_{SNF2}$$

$$V_{SF} = xI_{SF1}R_{SF} + xjwI_{SF1}L_{SF} + xjwI_{CF1}M_{CF-SF} +$$
$$xjwI_{CNF1}M_{CNF1-SF} + xjwI_{CNF2}M_{CNF2-SF} +$$
$$xjwI_{SNF1}M_{SNF1-SF} + xjwI_{SNF2}M_{SNF2-SF} - (1-x)$$
$$I_{SF2}R_{SF} - (1-x)jwI_{SF2}L_{SF} - (1-x)jwI_{CF2}M_{CF-SF} +$$
$$(1-x)jwI_{CNF1}M_{CNF1-SF} + (1-x)jwI_{CNF2}M_{CNF2-SF} +$$
$$(1-x)jwI_{SNF1}M_{SNF1-SF} + (1-x)jwI_{SNF2}M_{SNF2-SF}$$

$$V_{SNF} = xI_{SNF}R_{SNF} + xjwI_{SNF}L_{SNF} + xjwI_{CF1}M_{CF-SNF} +$$
$$xjwI_{CNF1}M_{CNF1-SNF} + xjwI_{CNF2}M_{CNF2-SNF} +$$
$$xjwI_{SF1}M_{SF-SNF} + xjwI_{SNF2}M_{SNF2-SNF} + (1-x)I_{SN\text{-}}$$
$$FR_{SNF} + (1-x)jwI_{SNF}L_{SNF} - (1-x)jwI_{CF2}M_{CF-SNF} +$$
$$(1-x)jwI_{CNF1}M_{CNF1-SNF} + (1-x)jwI_{CNF2}$$
$$M_{CNF2-SNF} - (1-x)jwI_{SF2}M_{SF-SNF} + (1-)$$
$$xjwI_{SNF2}M_{SNF2-SNF}$$

wherein
SF=shield in fault,
SNF=shield that is not in fault,
$S_{NF1}$=one of the shields that is not in fault,
$S_{NF2}$=the other shield that is not in fault,
CF=conductor in fault,
CNF1=one of the conductors that is not in fault,
CNF2=the other conductor that is not in fault,
$I_{SF1}$=The current of the shield in fault on one side of the fault point,
$I_{SF2}$=The current of the shield in fault on the other side of the fault point,
$I_{CF1}$=The current of the conductor in fault on one side of the fault point, and
$I_{CF2}$=The current of the conductor in fault on the other side of the fault point.

A second aspect of the invention relates to a system for locating a fault point F on a high-voltage three-phase AC cable 1.

The system of the invention is configured for locating a fault point F on a cable 1 comprising a first end 10, a second end 11, and at least one main section $MP_1$, $MP_2$, $MP_3$ extending between said ends 10, 11. The cable 1 comprises one conductor R, S, T per phase and three shields $S_A$, $S_B$, $S_C$; $S_R$, $S_S$, $S_T$ associated with said conductors R, S, T. The shields $S_A$, $S_B$, $S_C$; $S_R$, $S_S$, $S_T$ are attached to one another and connected to ground G at both ends of each main section $MP_1$, $MP_2$, $MP_3$.

The system of the invention comprises:
a first current measuring equipment configured for measuring the conductor current $I_{R1}$, $I_{S1}$, $I_{T1}$, $I_{R2}$, $I_{S2}$, $I_{T2}$ circulating through each conductor R, S, T both at the first end 10 and at the second end 11 of the cable 1, a second piece of measuring equipment configured for measuring the shield current $I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$; $I_{R1}$, $I_{S1}$, $I_{T1}$, $I_{R2}$, $I_{S2}$, $I_{T2}$ of each shield $S_A$, $S_B$, $S_C$; $S_R$, $S_S$, $S_T$ in the vicinity of the connection points to ground G of the shields $S_A$, $S_B$, $S_C$; $S_R$, $S_S$, $S_T$, and a computer configured for executing the method described in the first aspect of the invention based on the current measurements performed by said current measuring equipment.

In at least one embodiment, the computer used to implement the method of the invention may include one or more processors, one or more memory elements, storage, a bus, one or more network processing units interconnected with one or more network input/output (I/O) interfaces, one or more I/O interfaces, and a computer program.

The computer program comprises a plurality of instructions which, when executed by the processor, cause the processor to execute the steps of the method of the invention. In at least one embodiment, the processor or processors are at least a hardware processor configured to execute various tasks, operations and/or functions for the computer according to the software and/or the instructions configured for the computer, for example, in the computer program.

In at least one embodiment, the memory element and/or storage are configured to store data, information, software, and/or instructions associated with the computer, and/or the logic configured for the memory element and/or storage. In an embodiment of the computer, the computer program is stored in any combination of memory element(s) and/or storage.

In at least one embodiment, the bus can be configured as an interface that enables one or more elements of the computer to communicate with each other so as to exchange information and/or data. The bus can be implemented with any architecture designed for exchanging control, data, and/or information between processors, memory elements/storage, peripheral devices, and/or any other hardware and/or software component that may be configured for the computer.

In several embodiments, the network processor unit(s) may enable communication between the computer and other systems, entities, etc., through the network I/O interface(s) (wired and/or wireless). In several embodiments, the network processor unit(s) 510 can be configured as a combination of hardware and/or software, as one or more Ethernet drivers and/or controllers or interface cards, fibre channel (e.g., optical) driver(s) and/or controller(s), wireless receivers/transmitters/transceivers, baseband processor(s)/modem(s) and/or other similar network interface driver(s) and/or controller(s) that are known now or may be developed hereinafter so as to enable communications between the computer and other systems, entities, etc., to facilitate the operations for the various embodiments of the method described herein. In several embodiments, the network I/O interface(s) can be configured as one or more Ethernet ports, fibre channel ports, any other I/O port(s) and/or antennas/antenna array that are known now or may be developed in the future. Therefore, the network processor unit(s) and/or the network I/O interface(s) may include suitable interfaces for receiving, transmitting, and/or otherwise communicating data and/or information in a network environment.

I/O interfaces allow the input and output of data and/or information with other entities which may be connected to the computer. For example, the I/O interfaces may provide a connection to external devices such as a keyboard, numerical keypad, a touch screen, and/or any other suitable input and/or output device that is known now or may be developed in the future. In some instances, the external devices can also include (non-transitory) computer-readable storage media such as database systems, USB memories, portable optical or magnetic discs and memory cards. In still some instances, the external devices can be a mechanism for displaying data to a user, such as a computer monitor, a display screen, or the like.

Figure 1:
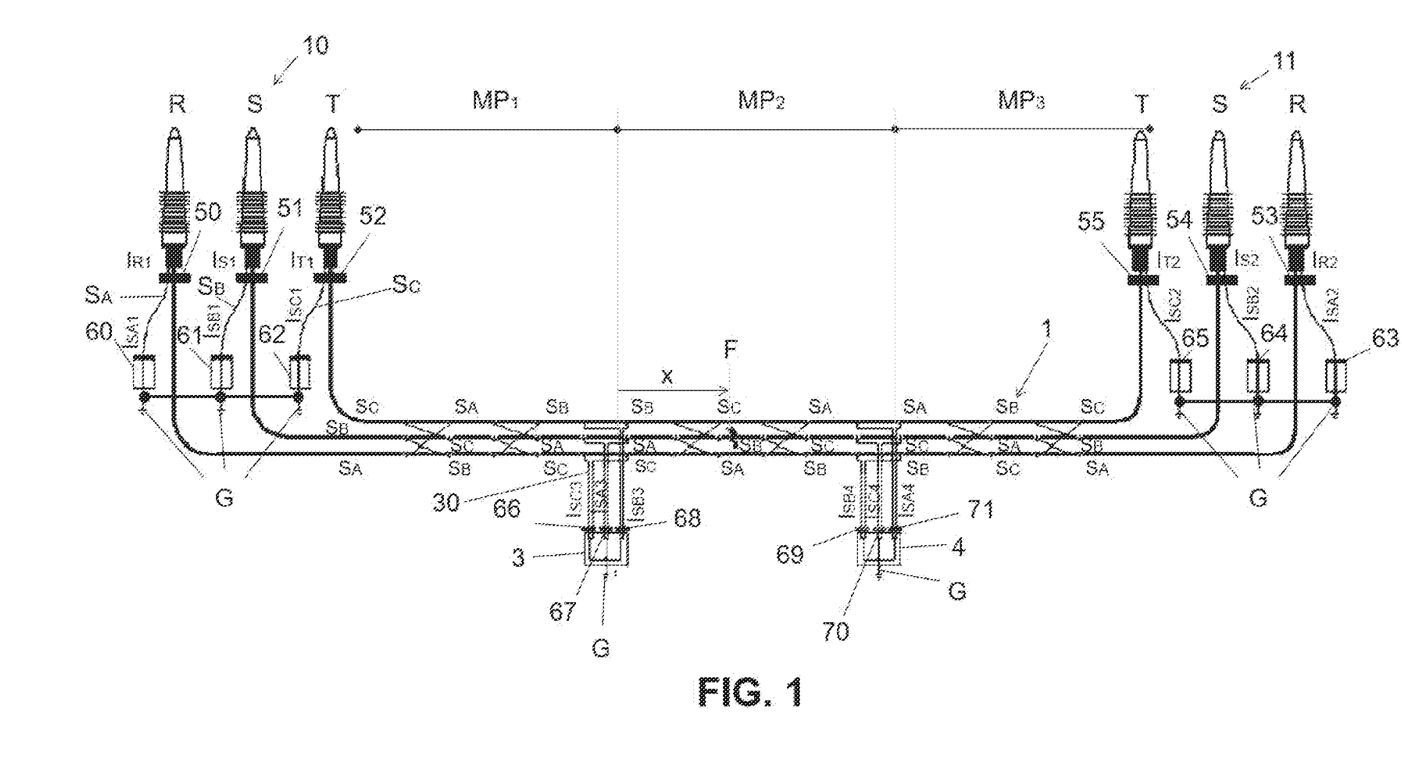
FIG. 1 schematically shows a system for locating a fault point on a cable according to a first embodiment of the invention applied on a cable having a first configuration.

FIG. 1 schematically shows a first embodiment of the system of the invention, said system being applied on a high-voltage three-phase AC cable 1 having a first cable configuration.

The cable 1 according to the first configuration has a cross bonding connection system. The cable 1 comprises a first end 10, a second end 11, and three main sections $MP_1$, $MP_2$, $MP_3$ extending between said ends 10, 11. The shields $S_A$, $S_B$, $S_C$ are attached to one another and connected to ground G at both ends of each main section $MP_1$, $MP_2$, $MP_3$. Each main section $MP_1$, $MP_2$, $MP_3$ comprises three minor sections $mp_1$, $mp_2$, $mp_3$ which are defined by the points where the shields $S_A$, $S_B$, $S_C$ are cross bonded.

In the first embodiment, the system comprises a first current measuring equipment configured for measuring the conductor current $I_{R1}$, $I_{S1}$, $I_{T1}$, $I_{R2}$, $I_{S2}$, $I_{T2}$ circulating through each conductor R, S, T both at the first end 10 and at the second end 11 of the cable 1. The first current measuring equipment comprises six current sensors 50, 51, 52, 53, 54, 55, with one current sensor 50, 51, 52, 53, 54, 55 being arranged at each end of each conductor R, S, T.

In the first embodiment, the system comprises a second current measuring equipment configured for measuring the shield current $I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$ of each shield $S_A$, $S_B$, $S_C$ in the vicinity of the connection points to ground G of the shields $S_A$, $S_B$, $S_C$. The second current measuring equipment comprises twelve current sensors 60, 61, 62, 63, 64, 65, 66, 67, 68, 69, 70, 71, with one current sensor 60, 61, 62, 63, 64, 65, 66, 67, 68, 69, 70, 71 being arranged in the vicinity of the connection points to ground G of each shield $S_A$, $S_B$, $S_C$. As previously discussed, although the measurement of shield currents $I_{SA1}$, $I_{SB1}$, $I_{SC1}$, $I_{SA2}$, $I_{SB2}$, $I_{SC2}$ at the ends 10, 11 of the cable 1 is exclusive to the corresponding main section $MP_1$, $MP_3$ (only shield current measurement), the measurement of shield currents $I_{SA3}$, $I_{SB3}$, $I_{SC3}$; $I_{SA4}$, $I_{SB4}$, $I_{SC4}$ in the intermediate connections to ground G does not present said separation, since the shields $S_A$, $S_B$, $S_C$ are attached to the corresponding grounding device 3, 4 through a coaxial cable 30, as shown for example in FIG. 1.

The system of the invention comprises a computer, not shown in the figures, configured for executing the method of the invention based on the current measurements performed by said current measuring equipment.

Figure 2:
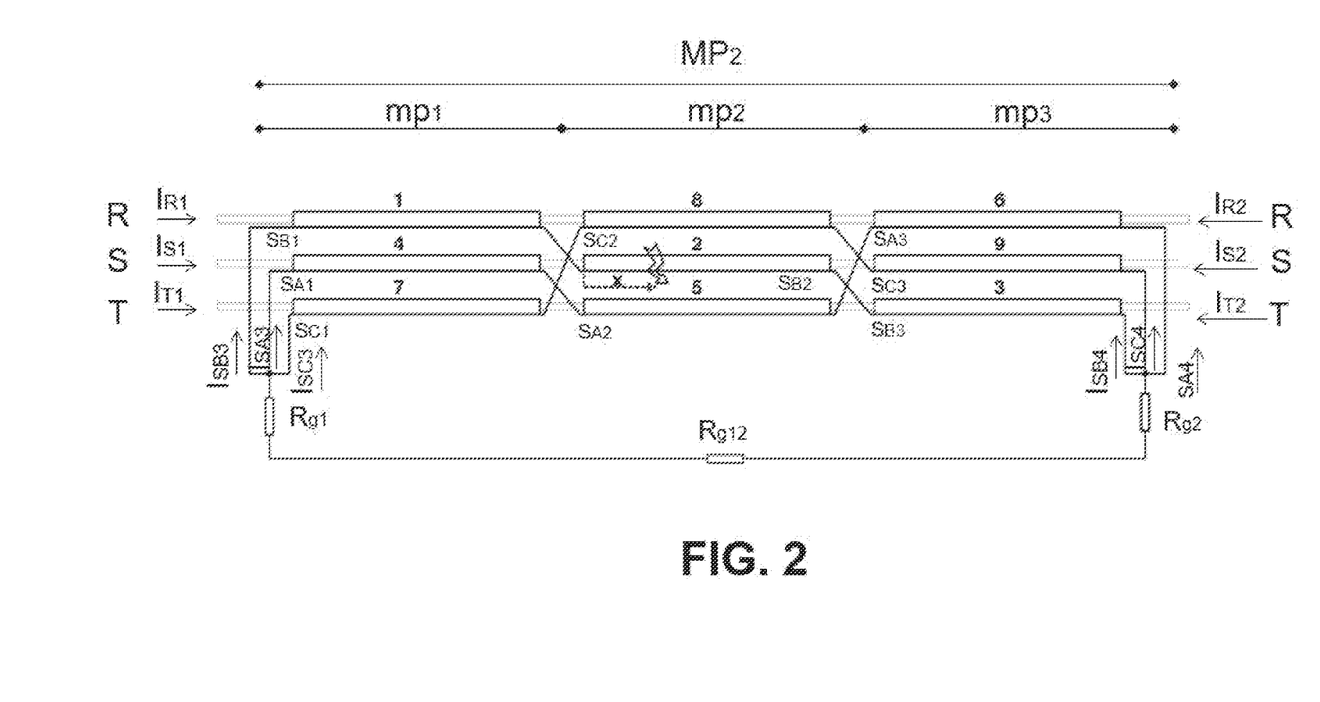
FIG. 2 shows the main section in fault of the cable of FIG. 1.

A fault between the conductor S and the shield $S_B$ in the main section $MP_2$ and the minor section mpg has been depicted in FIGS. 1 and 2. In order to locate said fault point F, the method of the invention would be applied as follows:

Measuring the conductor current $I_{R1}$, $I_{S1}$, $I_{T1}$, $I_{R2}$, $I_{S2}$, $I_{T2}$ circulating through each conductor R, S, T both at the first end 10 and at the second end 11 of the cable 1 by means of the first current measuring equipment.

Measuring the shield current $I_{SA1}$, $I_{SB1}$, $I_{SC1}$, $I_{SA2}$, $I_{SB2}$, $I_{SC2}$, $I_{SA3}$, $I_{SB3}$, $I_{SC3}$, $I_{SA4}$, $I_{SB4}$, $I_{SC4}$ circulating through each shield $S_A$, $S_B$, $S_C$ in the vicinity of the connection points to ground G of the shields $S_A$, $S_B$, $S_C$.

Comparing the conductor current $I_{R1}$; $I_{S1}$; $I_{T1}$ measured at the first end 10 of the cable 1 for each conductor R, S, T with the conductor current $I_{R2}$; $I_{S2}$; $I_{T2}$ measured at the second end 11 of the cable 1. In this case, the conductor current $I_{S1}$ of the conductor S at the first end 10 of the cable 1 will be different from the conductor current $I_{S2}$ at the first end 11, such that it will be determined that conductor S is the conductor that is in fault.

Likewise, for determining the main section $MP_1$, $MP_2$, $MP_3$ in fault, the shield currents $I_{SA1}$, $I_{SB1}$, $I_{SC1}$; $I_{SA2}$, $I_{SB2}$, $I_{SC2}$, $I_{SA3}$, $I_{SB3}$, $I_{SC3}$, $I_{SA4}$, $I_{SB4}$, $I_{SC4}$ are successively analysed starting from one of the ends 10, 11 of the cable 1, for example starting from the first end 10. After verifying that the shield currents $I_{SA1}$, $I_{SB1}$, $I_{SC1}$ at the first end 10 are in phase, it is ruled out that the main section $MP_1$ is the section that is in fault, and therefore the shield currents $I_{SA2}$, $I_{SB2}$, $I_{SC2}$ in the following connection point to ground G are analysed. Upon analysing said shield currents $I_{SA2}$, $I_{SB2}$, $I_{SC2}$, it will be observed that they are not in phase, determining that the main section $MP_1$, $MP_2$, $MP_3$ in fault will be the main section $MP_2$ after said connection point to ground G. If instead of starting from the first end 1 of the cable the analysis starts from the second end 11 of the cable 1, the result would be the same. It should be pointed out that since the shields $S_A$, $S_B$, $S_C$ are attached to one another at both ends of each main section $MP_1$, $MP_2$, $MP_3$, in the main section $MP_2$ in fault the shield currents $I_{SA3}$, $I_{SB3}$, $I_{SC3}$; $I_{SA4}$, $I_{SB4}$, $I_{SC4}$, are out of phase, but once the shield currents $I_{SA3}$, $I_{SB3}$, $I_{SC3}$; $I_{SA4}$, $I_{SB4}$, $I_{SC4}$ reach the end of the main section $MP_2$ in fault, in the rest of the main sections $MP_1$, $MP_3$ the distribution of the shield currents $I_{SA1}$, $I_{SB1}$, $I_{SC1}$; $I_{SA2}$, $I_{SB2}$, $I_{SC2}$ is the same for all the shields $S_A$, $S_B$, $S_C$.

Next, the minor section $mp_1$, $mp_2$, $mp_3$ is determined. To that end, first the shield $S_A$, $S_B$, $S_C$ in fault is determined by comparing for each shield $S_A$, $S_B$, $S_C$ the shield current $I_{SA2}$, $I_{SB2}$, $I_{SC2}$ measured at one of the ends of the main part $MP_2$ in fault with the shield current $I_{SA3}$, $I_{SB3}$, $I_{SC3}$ measured at the other end of the main part $MP_2$ in fault. In this case, it will be determined from the comparison that the shield current $I_{SB3}$ at the first end of the main section $MP_2$ in fault will be different from the shield current $I_{SB4}$ at the second end of the main section $MP_2$ in fault, determining that the shield $S_B$ is the section that is in fault. The minor section $mp_1$, $mp_2$, $mp_3$ in fault will be the minor section $mp_2$ in which the conductor S in fault and the shield $S_B$ in fault coincide.

It should be pointed out that up to this point, locating is based solely on the measurements performed by the current measuring equipment, and therefore, determining the minor section $mp_1$, $mp_2$, $mp_3$ in fault is performed without having to estimate any parameter or establish any model, and therefore it is performed univocally.

Figure 3:
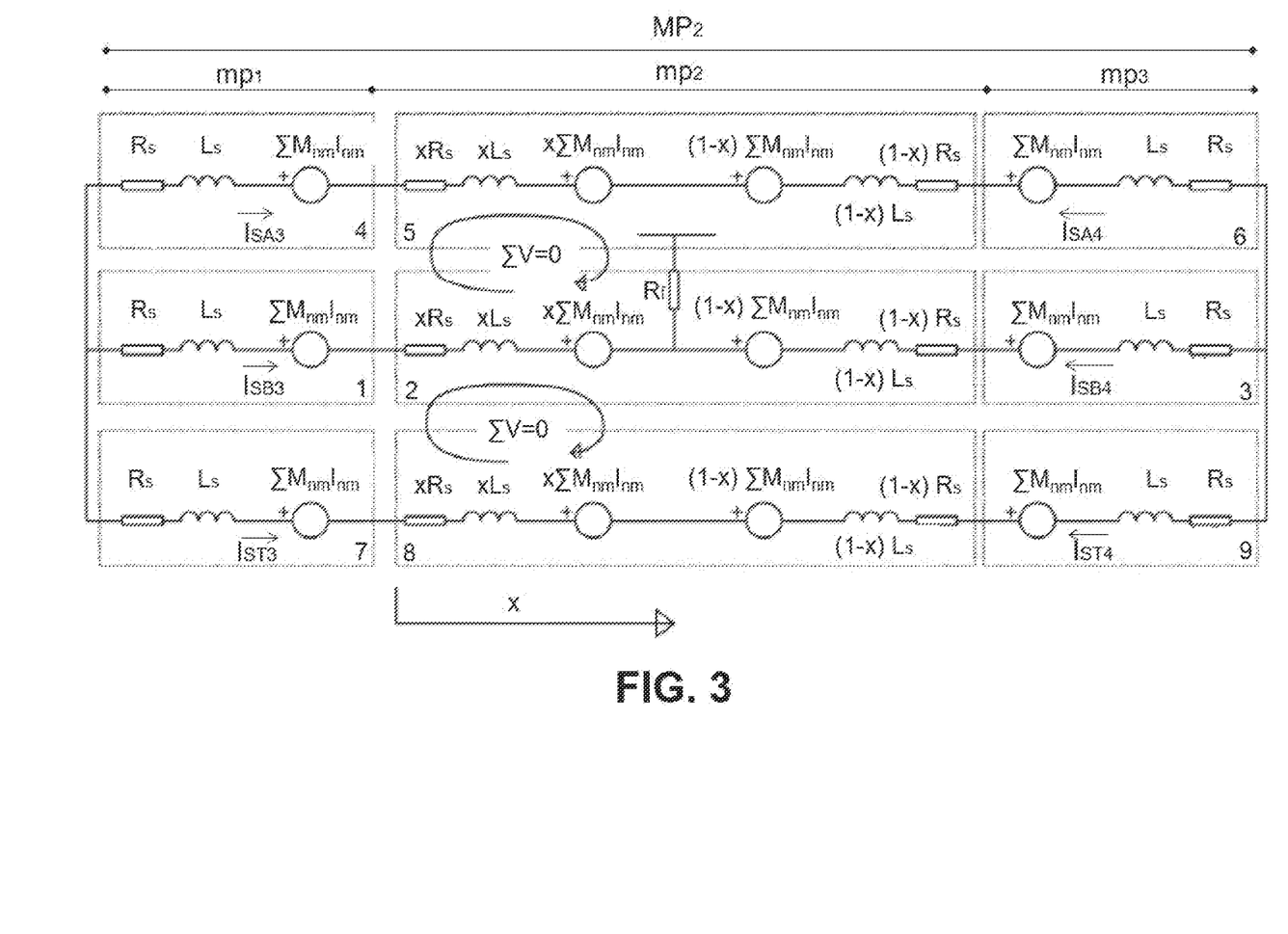
FIG. 3 shows the model of the shields of the main section in fault of the cable of FIG. 1.

Once the conductor S in fault, the main section $MP_2$ in fault, and the minor section $mp_2$ in fault are determined, the model of the shields $S_A$, $S_B$, $S_C$ of main section $MP_2$ in fault is defined. The model of the shields $S_A$, $S_B$, $S_C$ of the main section $MP_2$ in fault are observed in FIG. 3. As can be observed in said figure, since the shields $S_A$, $S_B$, $S_C$ are attached to one another at the ends of the main part $MP_2$ in fault, three nets $S_A$-$S_B$, $S_A$-$S_C$, $S_B$-$S_C$ in which the sum of the voltages is equal to zero, or in other words, the voltage at the ends of the shields is the same for the three shields, are created.

$$V_{SA} = V_{SB} = V_{SC}$$

Actually, since there is only one unknown (the distance x to the fault point), with the model of the shield $S_B$ which is in fault and the model of another one of the shields $S_B$, $S_C$ is sufficient to calculate the distance to the fault point.

Figure 4:
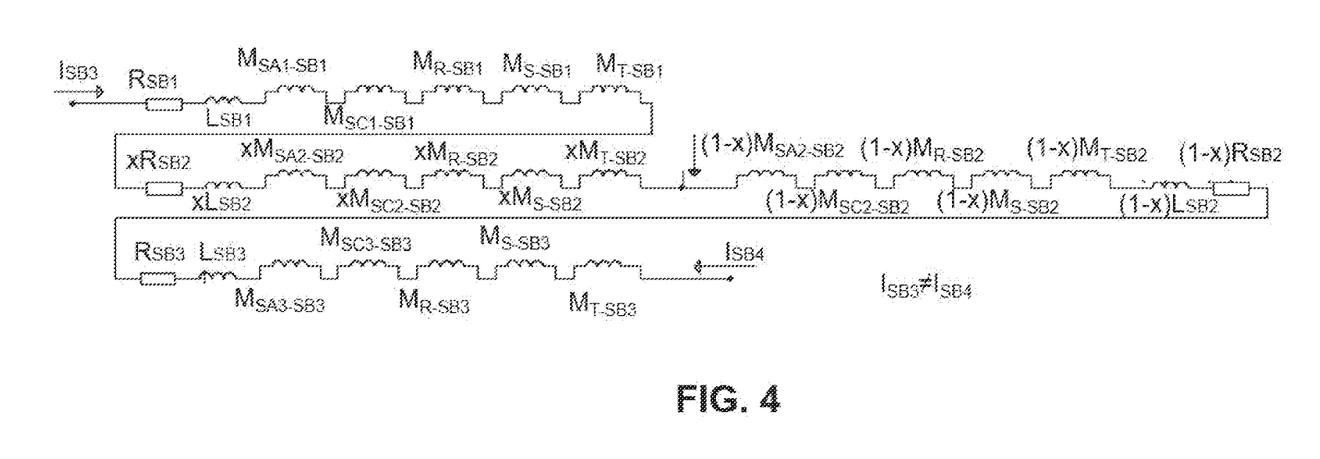
FIG. 4 shows in detail the model of the shield that is in fault of the main section in fault of the cable of FIG. 1.
Figure 5:
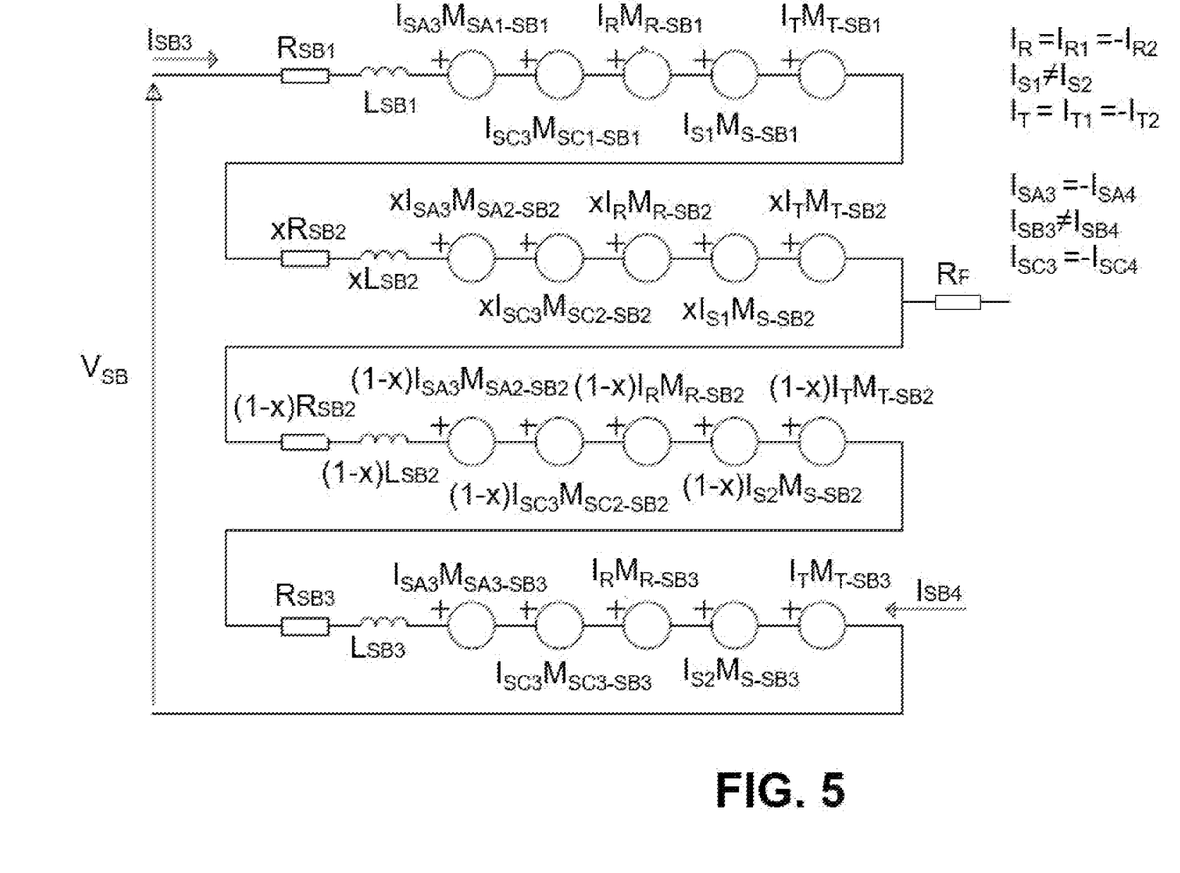
FIG. 5 shows the model of the shield of FIG. 4, in which the mutual inductances are depicted as generators.

FIG. 4 shows in detail the model of the shield $S_B$ which is in fault, whereas FIG. 5 shows said model of the shield $S_B$ which is in fault in which the mutual inductances are depicted as generators.

Figure 6:
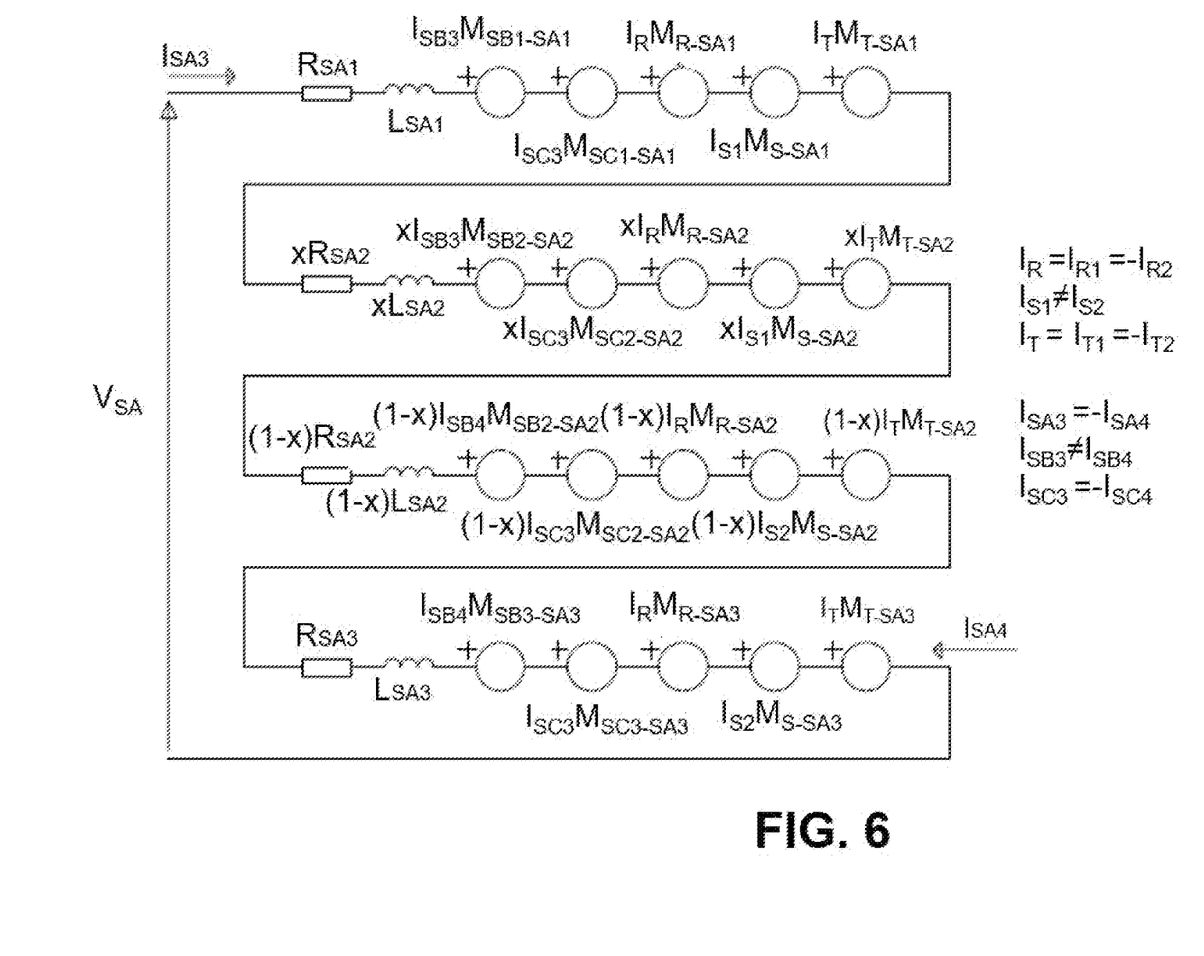
FIG. 6 shows the model of one of the shields that is not in fault of the main section in fault of the cable of FIG. 1, in which the mutual inductances are depicted as generators.

FIG. 6 shows the model of the shield $S_A$ which is not in fault in which the mutual inductances are depicted as generators.

Therefore, the model depicted of each shield $S_A$, $S_B$, $S_C$ comprises per minor section $mp_1$, $mp_2$, $mp_3$ its own resistance $R_{SA}$, $R_{SB}$, $R_{SC}$ and its own self-inductance $L_{SA}$, $L_{SB}$, $L_{SC}$ of the corresponding shield $S_A$, $S_B$, $S_C$, the mutual inductance $M_{SB-SA}$, $M_{SC-SA}$; $M_{SA-SB}$, $M_{SC-SB}$; $M_{SA-SC}$, $M_{SB-SC}$ between said shield $S_A$, $S_B$, $S_C$ and the rest of the shields $S_A$, $S_B$, $S_C$, and the mutual inductance $M_{R-SA}$, $M_{S-SA}$, $M_{T-SA}$; $M_{R-SB}$, $M_{S-SB}$, $M_{T-SB}$; $M_{R-SC}$, $M_{S-SC}$, $M_{T-SC}$ between said shield $S_A$, $S_B$, $S_C$ and the conductors R, S, T.

Therefore, the location of the fault point depicted in FIGS. 1 and 2 is calculated by means of the following equations:

$$V_{SB} = I_{SB3}R_{SB1} + jwI_{SB3}L_{SB1} + jwI_RM_{R-SB1} + jwI_{S1}M_{S-SB1} + \\ jwI_TM_{T-SB1} + jwI_{SA3}M_{SA1-SB1} + jwI_{SC3} \\ M_{SC1-SB1}xI_{SB3}R_{SB2} + xjwI_{SB3}L_{SB2} + jwI_RM_{R-SB2} + \\ xjwI_{S1}M_{S-SB2} + xjwI_TM_{T-SB2} + xjwI_{SA3}M_{SA2-SB2} + \\ xjwI_{SC3}M_{SC2-SB2} - (1-x)I_{SB4}R_{SB2} - (1-x) \\ jwI_{SB4}L_{SB2} + (1-x)jwI_RM_{R-SB2} - (1-x)jwI_{S2}M_{S-SB2} + \\ (1-x)jwI_TM_{T-SB2} + (1-x)jwI_{SA3}M_{SA2-SB2} + (1-x) \\ jwI_{SC3}M_{SC2-SB2} - I_{SB4}R_{SB3} - jwI_{SB4}L_{SB3} + jwI_R \\ M_{R-SB3} - jwI_{S2}M_{S-SB3} + jwI_TM_{T-SB3} + jwI_{SA3} \\ M_{SA3-SB3} + jwI_{SC3}M_{SC3-SB3}$$

$$V_{SA} = I_{SA3}R_{SA1} + jwI_{SA3}L_{SA1} + jwI_RM_{R-SA1} + jwI_{S1}M_{S-SA1} + \\ jwI_TM_{T-SA1} + jwI_{SB3}M_{SB1-SA1} + jwI_{SC3} \\ M_{SC1-SA1}xI_{SA3}R_{SA2} + xjwI_{SB3}L_{SA2} + xjwI_RM_{R-SA2} + \\ xjwI_{S1}M_{S-SA2} + xjwI_TM_{T-SA2} + xjwI_{SB3}M_{SB2-SA2} + \\ xjwI_{SC3}M_{SC2-SA2} + (1-x)I_{SA3}R_{SA2} + (1-x) \\ jwI_{SA3}L_{SA2} + (1-x)jwI_RM_{R-SA2} - (1-x)jwI_{S2}M_{S-SA2} + \\ (1-x)jwI_TM_{T-SA2} + -(1-x)jwI_{SB4}M_{SB2-SA2} + (1-x) \\ jwI_{SC3}M_{SC2-SA2} + I_{SA3}R_{SA3} + jwI_{SA3}L_{SA3} + jwI_R \\ M_{R-SA3} - jwI_{S2}M_{S-SA3} + jwI_TM_{T-SA3} + jwI_{SB4} \\ M_{SB3-SA3} + jwI_{SC3}M_{SC3-SA3}$$

$$V_{SA} = V_{SB} = V_{SC}$$

Figure 7:
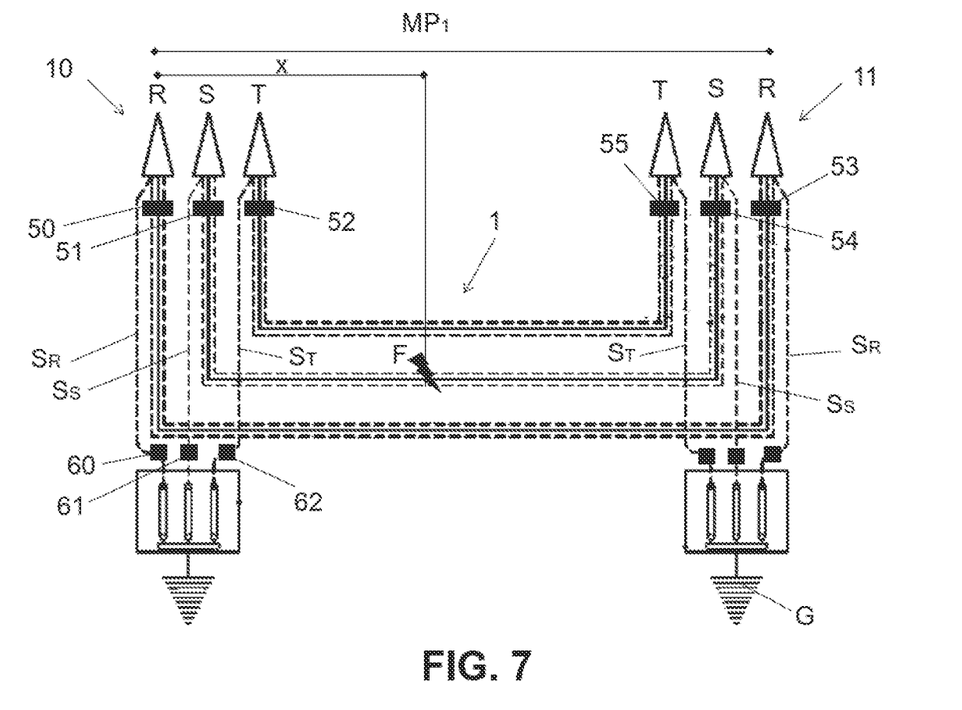
FIG. 7 schematically shows a system for locating a fault point on a cable according to a second embodiment of the invention applied on a cable having a second configuration.

FIG. 7 schematically shows a second embodiment of the system of the invention, said system being applied on a high-voltage three-phase AC cable 1 having a second cable configuration.

The cable 1 according to the second configuration has a solid bonded connection system. The cable 1 comprises a first end 10, a second end 11, and a single main section $MP_1$ extending between said ends 10, 11. The cable 1 comprises one conductor R, S, T and one shield $S_R$, $S_S$, $S_T$ per phase. The shields $S_R$, $S_S$, $S_T$ are attached to one another and connected to ground G at both ends of the main section $MP_1$.

In the first embodiment, the system comprises a first current measuring equipment configured for measuring the conductor current $I_{R1}$, $I_{S1}$, $I_{T1}$, $I_{R2}$, $I_{S2}$, $I_{T2}$ circulating through each conductor R, S, T both at the first end 10 and at the second end 11 of the cable 1. The first current measuring equipment comprises six current sensors 50, 51, 52, 53, 54, 55, with one current sensor 50, 51, 52, 53, 54, 55 being arranged at each end of each conductor R, S, T.

In the first embodiment the system comprises a second current measuring equipment configured for measuring the shield current $I_{SR1}$, $I_{SS1}$, $I_{ST1}$; $I_{SR2}$, $I_{SS2}$, $I_{ST2}$; of each shield $S_R$, $S_S$, $S_T$ in the vicinity of the connection points to ground G of the shields $S_R$, $S_S$, $S_T$. The second current measuring equipment comprises six current sensors 60, 61, 62, 63, 64, 65, with one current sensor 60, 61, 62, 63, 64, 65 being arranged in the vicinity of the connection points to ground G of each shield $S_R$, $S_S$, $S_T$.

The system of the invention comprises a computer, not shown in the figures, configured for executing the method of the invention based on the current measurements performed by said current measuring equipment 50, 51, 52, 53, 54, 55, 60, 61, 62, 63, 64, 65.

A fault between the conductor S and the shield $S_S$ has been depicted in FIG. 7. In order to locate said fault point F, the method of the invention would be applied as follows:

Measuring the conductor current $I_{R1}$, $I_{S1}$, $I_{T1}$, $I_{R2}$, $I_{S2}$, $I_{T2}$ circulating through each conductor R, S, T both at the first end 10 and at the second end 11 of the cable 1 by means of the first current measuring equipment 5.

Measuring the shield current $I_{SR1}$, $I_{SS1}$, $I_{ST1}$; $I_{SR2}$, $I_{SS2}$, $I_{ST2}$ circulating through each shield $S_A$, $S_B$, $S_C$ in the vicinity of the connection points to ground G of the shields $S_R$, $S_S$, $S_T$.

Comparing the conductor current $I_{R1}$; $I_{S1}$; $I_{T1}$ measured at the first end 10 of the cable 1 for each conductor R, S, T with the conductor current $I_{R2}$; $I_{S2}$; $I_{T2}$ measured at the second end 11 of the cable 1. In this case, the conductor current $I_{S1}$ of the conductor S at the first end 10 of the cable 1 will be different from the conductor current $I_{S2}$ at the first end 11, such that it will be determined that conductor S is the conductor that is in fault.

Once the conductor S in fault has been determined, the model of the shields $S_R$, $S_S$, $S_T$ is defined.

The model of each shield $S_R$, $S_S$, $S_T$ comprises its own resistance $R_{SS}$, $R_{SR}$, $R_{SC}$ and its own self-inductance $L_{SS}$, $L_{SR}$, $L_{ST}$ of the corresponding shield $S_R$, $S_S$, $S_T$, the mutual inductance $M_{SS-SR}$, $M_{ST-SR}$; $M_{SR-SS}$, $M_{ST-SS}$; $M_{SR-ST}$, $M_{SS-ST}$ between said shield $S_R$, $S_S$, $S_T$ and the rest of the shields $S_R$, $S_S$, $S_T$, and the mutual inductance $M_{R-SR}$, $M_{S-SR}$, $M_{T-SR}$; $M_{R-SS}$, $M_{S-SS}$, $M_{T-SS}$; $M_{R-ST}$, $M_{S-ST}$, $M_{T-ST}$ between said shield $S_R$, $S_S$, $S_T$ and the conductors R, S, T.

As previously discussed, the shields $S_R$, $S_S$, $S_T$ are attached and connected to ground at both ends of the main section $MP_1$. For this reason, in the model of the shields $S_R$, $S_S$, $S_T$ the ends of the models corresponding to each shield $S_A$, $S_B$, $S_C$ are attached to one another, such that three nets in which the sum of voltages is zero are formed.

Figure 8:
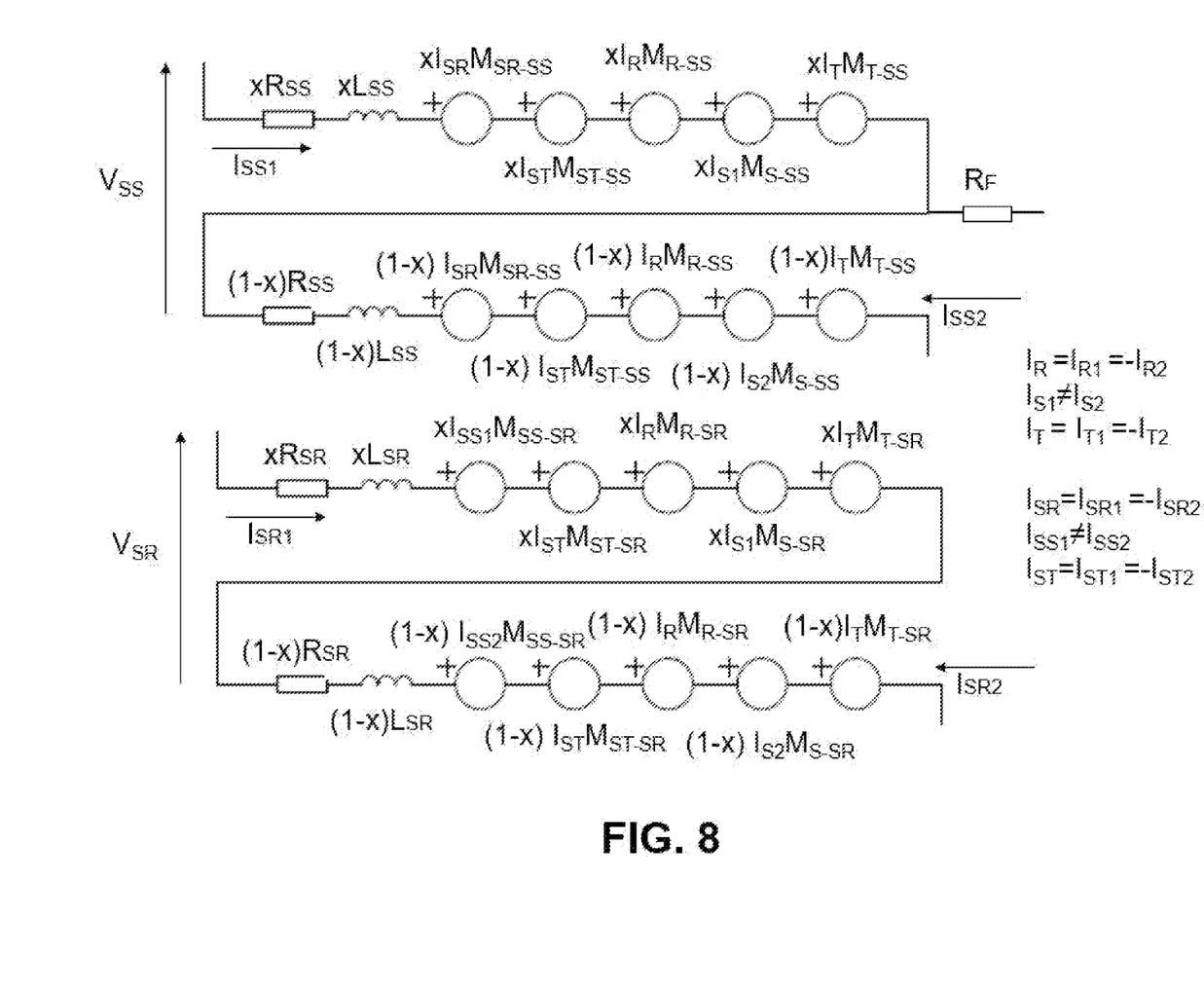
FIG. 8 shows the detailed model of the shields $S_R$ and $S_S$ of FIG. 7.

FIG. 8 shows the detailed model of the shields $S_R$ and $S_S$.

Therefore, the location of the fault point depicted in FIGS. 1 and 2 is calculated by means of the following equations:

$$V_{SS} = xI_{SS1}R_{SS} + xjwI_{SS1}L_{SS} + xjwI_RM_{R-SS} + xjwI_{S1}M_{S-SS} + \\ xjwI_TM_{T-SS} + xjwI_{SR}M_{SR-SS} + xjwI_{ST}M_{ST-SS} - (1-x) \\ I_{SS2}R_{SS} - (1-x)jwI_{SS2}L_{SS} + (1-x)jwI_RM_{R-SS}(1-x) \\ jwI_{S2}M_{S-SS} + (1-x)jwI_TM_{T-SS} + (1-x)jwI_{SR}M_{SR-SS} + \\ (1-x)jwI_{ST}M_{ST-SS}$$

$$V_{SR} = xI_{SR}R_{SR} + xjwI_{SR}L_{SR} + xjwI_RM_{R-SR} + xjwI_{S1}M_{S-SR} + \\ xjwI_TM_{T-SR} + xjwI_{SS1}M_{SS-SR} + xjwI_{ST}M_{ST-SR} - (1-x) \\ I_{SR}R_{SR} - (1-x)jwI_{SR}L_{SR} + (1-x)jwI_RM_{R-SR} - (1-x) \\ jwI_{S2}M_{S-SR} + (1-x)jwI_TM_{T-} \quad _{SR} - (1-x)jwI_{SS2} \\ M_{SS-SR} + (1-)jwI_{ST}M_{ST-SR \; ST-SR}$$

$$V_{SR} = U_{SS} = U_{ST}$$

Additional embodiments and combinations thereof are disclosed in the clauses that follow.

Clause 1. A method for locating a fault point (F) on a high-voltage three-phase AC cable (1) comprising a first end (10), a second end (11), and at least one main section ($MP_1$, $MP_2$, $MP_3$) extending between said ends (10, 11), the cable (1) comprising one conductor (R, S, T) per phase and three shields ($S_A$, $S_B$, $S_C$; $S_R$, $S_S$, $S_T$) associated with said conductors (R, S, T), said shields ($S_A$, $S_B$, $S_C$; $S_R$, $S_S$, $S_T$) being attached to one another and connected to ground (G) at both ends of each main section ($MP_1$, $MP_2$, $MP_3$), the method comprising:

measuring the conductor current $(I_{R1}, I_{S1}, I_{T1}, I_{R2}, I_{S2}, I_{T2})$ circulating through each conductor (R, S, T) both at the first end (10) and at the second end (11) of the cable (1), measuring the shield current $(I_{SA1}, I_{SB1}, I_{SC1}, I_{SA2}, I_{SB2}, I_{SC2}, I_{SA3}, I_{SB3}, I_{SC3}, I_{SA4}, I_{SB4}, I_{SC4}; I_{SR1}, I_{SS1}, I_{ST1}, I_{SR2}, I_{SS2}, I_{ST2})$ in the vicinity of the connection points to ground (G) of the shields $(S_A, S_B, S_C)$, determining the conductor (R, S, T) in fault based on the previously measured conductor currents $(I_{R1}, I_{S1}, I_{T1}, I_{R2}, I_{S2}, I_{T2})$, in the event that the cable (1) comprises more than one main section $(MP_1, MP_2, MP_3)$, determining the main section $(MP_1, MP_2, MP_3)$ in fault based on the previously measured shield currents $(I_{SA1}, I_{SB1}, I_{SC1}, I_{SA2}, I_{SB2}, I_{SC2}, I_{SA3}, I_{SB3}, I_{SC3}, I_{SA4}, I_{SB4}, I_{SC4}, I_{SR1}, I_{SS1}, I_{ST1}; I_{SR2}, I_{SS2}, I_{ST2})$, and locating the fault point (F) by means of a model of the shields $(S_A, S_B, S_C; S_R, S_S, S_T)$ of the main section $(MP_1, MP_2, MP_3)$ in fault, taking into account that the shields $(S_A, S_B, S_C; S_R, S_S, S_T)$ are attached to one another at the ends of said main part $(MP_1, MP_2, MP_3)$ in fault such that three closed nets in which the sum of voltages is zero are formed in the model, the only unknown being the distance (x) to the fault point (F).

Clause 2. The method according to clause 1, wherein for determining the conductor (R, S, T) in fault, the conductor current $(I_{R1}; I_{S1}; I_{T1})$ measured at the first end (10) of the cable (1) for each conductor (R, S, T) is compared with the conductor current $(I_{R2}; I_{S2}; I_{T2})$ measured at the second end (11) of the cable (1), determining that the conductor (R, S, T) in fault will be the conductor in which the conductor current $(I_{R1}, I_{R2}; I_{S1}, I_{S2}; I_{T1}, I_{T2})$ at said ends (10, 11) is different.

Clause 3. The method according to clause 1 or 2, wherein the cable (1) comprises at least two main sections $(MP_1, MP_2, MP_3)$, the main section $(MP_1, MP_2, MP_3)$ in fault being determined taking into account that at the ends of said main section $(MP_1, MP_2, MP_3)$ in fault the shield currents $(I_{SA1}, I_{SB1}, I_{SC1}; I_{SA2}, I_{SB2}, I_{SC2}, I_{SA3}, I_{SB3}, I_{SC3}, I_{SA4}, I_{SB4}, I_{SC4})$ are not in phase.

Clause 4. The method according to clause 3, wherein for determining the main section $(MP_1, MP_2, MP_3)$ in fault the shield currents $(I_{SA1}, I_{SB1}, I_{SC1}; I_{SA2}, I_{SB2}, I_{SC2}, I_{SA3}, I_{SB3}, I_{SC3}; I_{SA4}, I_{SB4}, I_{SC4})$ are successively analysed starting from one of the ends (10, 11) of the cable (1) until observing that the shield currents $(I_{SA1}, I_{SB1}, I_{SC1}; I_{SA2}, I_{SB2}, I_{SC2}; I_{SA3}, I_{SB3}, I_{SC3}; I_{SA4}, I_{SB4}, I_{SC4})$ are not in phase, determining that the main section $(MP_1, MP_2, MP_3)$ in fault will be the main section $(MP_1, MP_2, MP_3)$ after the connection point to ground (G) in which it is detected that said shield currents $(I_{SA1}, I_{SB1}, I_{SC1}; I_{SA2}, I_{SB2}, I_{SC2}, I_{SA3}, I_{SB3}, I_{SC3}, I_{SA4}, I_{SB4}, I_{SC4})$ are not in phase.

Clause 5. The method according to any of clauses 1 to 4, wherein the cable (1) has a cross bonding configuration, each main section $(MP_1, MP_2, MP_3)$ comprising three minor sections $(mp_1, mp_2, mp_3)$, the method comprising determining the minor section $(mp_1, mp_2, mp_3)$ in fault once the main section $(MP_1, MP_2, MP_3)$ in fault has been determined, wherein for determining the minor section $(mp_1, mp_2, mp_3)$ in fault, first the shield $(S_A, S_B, S_C)$ in fault is determined by comparing for each shield $(S_A, S_B, S_C)$ the shield current $(I_{SA1}, I_{SB1}, I_{SC1}; I_{SA2}, I_{SB2}, I_{SC2}; I_{SA3}, I_{SB3}, I_{SC3}, I_{SA4}, I_{SB4}, I_{SC4})$ measured at one of the ends of the main part $(MP_1, MP_2, MP_3)$ in fault with the shield current $(I_{SA1}, I_{SB1}, I_{SC1}; I_{SA2}, I_{SB2}, I_{SC2}, I_{SA3}, I_{SB3}, I_{SC3}, I_{SA4}, I_{SB4}, I_{SC4})$ measured at the other end of the main part $(MP_1, MP_2, MP_3)$ in fault, the shield $(S_A, S_B, S_C)$ in fault being the shield $(S_A, S_B, S_C)$ whose current $(I_{SA1}, I_{SB1}, I_{SC1}; I_{SA2}, I_{SB2}, I_{SC2}, I_{SA3}, I_{SB3}, I_{SC3}, I_{SA4}, I_{SB4}, I_{SC4})$ at both ends of the main section $(MP_1, MP_2, MP_3)$ in fault is different, and the minor section $(mp_1, mp_2, mp_3)$ in fault being the minor section $(mp_1, mp_2, mp_3)$ in which the conductor (R, S, T) in fault and the shield $(S_A, S_B, S_C)$ in fault coincide.

Clause 6. The method according to clause 5, wherein the model of the shields $(S_A, S_B, S_C)$ of the main section $(MP_1, MP_2, MP_3)$ in fault of each shield $(S_A, S_B, S_C)$ comprises per minor section $(mp_1, mp_2, mp_3)$ its own resistance $(R_{SA}, R_{SB}, R_{SC})$ and its own self-inductance $(L_{SA}, L_{SB}, L_{SC})$ of the corresponding shield $(S_A, S_B, S_C)$, the mutual inductance $(M_{SB-SA}, MP_{SC-SA}; M_{SA-SB}, MP_{SC-SB}; MP_{SA-SC}, MP_{SB-SC})$ between said shield $(S_A, S_B, S_C)$ and the rest of the shields $(S_A, S_B, S_C)$, and the mutual inductance $(M_{R-SA}, M_{S-SA}, M_{T-SA}; M_{R-SB}, M_{S-SB}, MP_{T-SC}; MP_{R-SC}, MP_{S-SC}, MP_{T-SC})$ between said shield $(S_A, S_B, S_C)$ and the conductors (R, S, T).

Clause 7. The method according to clause 6, wherein the location of the fault point (F) is calculated by means of the following equations:

$$V_{SF}=V_{SNF}$$

$$V_{SF}=V_{SF\_mpf}+V_{SF\_mpnf1}+V_{SF\_mpnf2}$$

$$\begin{aligned}V_{SF_{mpf}}=&xI_{SF1}R_{SF_{mpf}}+xjwI_{SF1}L_{SF_{mpf}}+xjwI_{CF1}M_{CF-SF_{mpf}}+\\&xjwI_{CNF1}M_{CNF1-SF_{mpf}}+xjwI_{CNF2}M_{CNF2-SF_{mpf}}+\\&xjwI_{SNF1}M_{SNF1-SF_{mpf}}+xjwI_{SNF2}M_{SNF2-SF_{mpf}}-(1-x)\\&I_{SF2}R_{SF_{mpf}}-(1-x)jwI_{SF2}L_{SF_{mpf}}-(1-x)jwI_{CF2}\\&M_{CF-SF_{mpf}}+(1-X)jwI_{CNF1}M_{CNF1-SF_{mpf}}+(1-X)\\&jwI_{CNF2}M_{CNF2-SF_{mpf}}+(1-X)jwI_{SNF1}M_{SNF1-SF_{mpf}}+\\&(1-X)jwI_{SNF2}M_{SNF2-SF_{mpf}}\end{aligned}$$

$$\begin{aligned}V_{SF_{mpnf}}=&I_{SF}R_{SF_{mpnf}}+jwI_{SF}L_{SF_{mpnf}}+jwI_{CF}M_{CF-SF_{mpnf}}+\\&jwI_{CNF1}M_{CNF1-SF_{mpnf}}+jwI_{CNF2}M_{CNF2-SF_{mpnf}}+\\&jwI_{SNF1}M_{SNF1-SF_{mpnf}}+jwI_{SNF2}M_{SNF2-SF_{mpnf}}\end{aligned}$$

$$V_{SNF}=V_{SNF\_mpf}+V_{SNF\_mpnf1}+V_{SNF\_mpnf2}$$

$$\begin{aligned}V_{SNF_{mpf}}=&xI_{SNF}R_{SNF_{mpf}}+xjwI_{SNF1}L_{SNF_{mpf}}+xjwI_{CF1}\\&M_{CF-SNF_{mpf}}+xjwI_{CNF1}M_{CNF1-SNF_{mpf}}+\\&xjwI_{CNF2}M_{CNF2-SNF_{mpf}}+xjwI_{SF1}M_{SF-SNF_{mpf}}+\\&xjwI_{SNF2}M_{SNF2-SNF_{mpf}}+(1-x)I_{SNF}R_{SNF_{mpf}}+(1-x)\\&jwI_{SNF}L_{SNF_{mpf}}-(1-x)jwI_{CF2}M_{CF-SNF_{mpf}}+(1-X)\\&jwI_{CNF1}M_{CNF1-SNF_{mpf}}+(1-X)jwI_{CNF2}\\&M_{CNF2-SNF_{mpf}}-(1-X)jwI_{SF2}M_{SF-SNF_{mpf}}+(1-X)\\&jwI_{SNF2}M_{SNF2-SNF_{mpf}}\end{aligned}$$

$$\begin{aligned}V_{SNF_{mpnf}}=&I_{SNF}R_{SNF_{mpnf}}+jwI_{SNF}L_{SNF_{mpnf}}+jwI_{CF}\\&M_{CF-SNF_{mpnf}}+jwI_{CNF1}M_{CNF1-SNF_{mpnf}}+\\&jwI_{CNF2}M_{CNF2-SNF_{mpnf}}+jwI_{SF}M_{SF-SNF_{mpnf}}+\\&jwI_{SNF2}M_{SNF2-SNF_{mpnf}}\end{aligned}$$

wherein
SF=shield in fault,
SNF=shield that is not in fault,
SNF1=one of the shields that is not in fault,
SNF2=the other shield that is not in fault,
CNF1=one of the conductors that is not in fault,
CNF2=the other conductor that is not in fault,
mpf=the minor section in fault,
mpnf=minor section which is not in fault,
$I_{SF1}$=The current of the shield in fault on one side of the fault point,
$I_{SF2}$=The current of the shield in fault on the other side of the fault point,
$I_{SF}$=the current circulating through the shield in fault in the section in fault, if the current flows from the first end to the second end, it will be considered positive; in contrast, if it flows from the second end to the first end, it will be considered negative,
$I_{CF}$=The current circulating through the conductor in fault. If the current flows from the first end to the second end, it will be considered positive; in contrast, if it flows from the second end to the first end, it will be considered negative, $I_{CF1}$=The current of the conductor in fault on one side of the fault point, and $I_{CF2}$=The current of the conductor in fault on the other side of the fault point.

Clause 8. The method according to clause 1 or 2, wherein the cable (1) has a solid bonded configuration such that it comprises a single main section (MP$_1$), the model of the shields (S$_R$, S$_S$, S$_T$) of each shield (S$_R$, S$_S$, S$_T$) comprising its own resistance (R$_{SR}$, R$_{SS}$, R$_{ST}$) and self-inductance (L$_{SR}$, L$_{SS}$, L$_{ST}$), the mutual inductance (M$_{SS-SR}$, M$_{ST-SR}$; M$_{SR-SS}$, M$_{ST-SS}$; M$_{SR-ST}$, M$_{SS-ST}$) between said shield (S$_R$, S$_S$, S$_T$) and the rest of the shields (S$_R$, S$_S$, S$_T$), and the mutual inductance (M$_{R-SR}$, M$_{S-SR}$, M$_{T-SR}$; M$_{R-SS}$, M$_{S-SS}$, M$_{T-SS}$; M$_{R-ST}$, M$_{S-ST}$, M$_{T-ST}$) between said shield (S$_R$, S$_S$, S$_T$) and the conductors (R, S, T).

Clause 9. The method according to clause 8, wherein the location of the fault point (F) is calculated by means of the following equations:

$$V_{SF}=V_{SNF}$$

$$V_{SF}=xI_{SF1}R_{SF}+xjwI_{SF1}L_{SF}+xjwI_{CF1}M_{CF-SF}+$$
$$xjwI_{CNF1}M_{CNF1-SF}+xjwI_{CNF2}M_{CNF2-SF}+$$
$$xjwI_{SNF1}M_{SNF1-SF}+xjwI_{SNF2}M_{SNF2-SF}-(1-x)$$
$$I_{SF2}R_{SF}-(1-x)jwI_{SF2}L_{SF}-(1-x)jwI_{CF2}M_{CF-SF}+$$
$$(1-x)jwI_{CNF1}M_{CNF1-SF}+(1-x)jwI_{CNF2}M_{CNF2-SF}+$$
$$(1-x)jwI_{SNF1}M_{SNF1-SF}+(1-x)jwI_{SNF2}M_{SNF2-SF}$$

$$V_{SNF}=xI_{SNF}R_{SNF}+xjwI_{SNF}L_{SNF}+xjwI_{CF1}M_{CF-SNF}+$$
$$xjwI_{CNF1}M_{CNF1-SNF}+xjwI_{CNF2}M_{CNF2-SNF}+$$
$$xjwI_{SF1}M_{SF-SNF}+xjwI_{SNF2}M_{SNF2-SNF}+(1-x)I_{SN}$$
$$FR_{SNF}+(1-x)jwI_{SNF}L_{SNF}-(1-x)jwI_{CF2}M_{CF-SNF}+$$
$$(1-x)jwI_{CNF1}M_{CNF1-SNF}+(1-x)jwI_{CNF2}$$
$$M_{CNF2-SNF}-(1-x)jwI_{SF2}M_{SF-SNF}+(1-)$$
$$xjwI_{SNF2}M_{SNF2-SNF}$$

wherein

SF=shield in fault,
SNF=shield that is not in fault,
SNF1=one of the shields that is not in fault,
SNF2=the other shield that is not in fault,
CF=conductor in fault,
CNF1=one of the conductors that is not in fault,
CNF2=the other conductor that is not in fault,
$I_{SF1}$=The current of the shield in fault on one side of the fault point,
$I_{SF2}$=The current of the shield in fault on the other side of the fault point,
$I_{CF1}$=The current of the conductor in fault on one side of the fault point, and
$I_{CF2}$=The current of the conductor in fault on the other side of the fault point.

Clause 10. A system for locating a fault point (F) in a high-voltage three-phase AC cable (1) comprising a first end (10), a second end (11), and at least one main section (MP$_1$, MP$_2$, MP$_3$) extending between said ends (10, 11), the cable (1) comprising one conductor (R, S, T) per phase and three shields (S$_A$, S$_B$, S$_C$; S$_R$, S$_S$, S$_T$) associated with said conductors (R, S, T), said shields (S$_A$, S$_B$, S$_C$; S$_R$, S$_S$, S$_T$) being attached to one another and connected to ground (G) at both ends of each main section (MP$_1$, MP$_2$, MP$_3$), the system comprising:

a first current measuring equipment configured for measuring the current of conductor ($I_{R1}$, $I_{S1}$, $I_{T1}$, $I_{R2}$, $I_{S2}$, $I_{T2}$) circulating through each conductor (R, S, T) both at the first end (10) and at the second end (11) of the cable (1), a second current measuring equipment configured for measuring the shield current ($I_{SA1}$, $I_{SB1}$, $I_{SC1}$, $I_{SA2}$, $I_{SB2}$, $I_{SC2}$, $I_{SA3}$, $I_{SB3}$, $I_{SC3}$, $I_{SA4}$, $I_{SB4}$, $I_{SC4}$; $I_{SR1}$, $I_{SS1}$, $I_{ST1}$; $I_{SR2}$, $I_{SS2}$, $I_{ST2}$) in the vicinity of the connection points to ground (G) of the shields (S$_A$, S$_B$, S$_C$), and a computer configured for executing the method according to any of claims 1 to 9 based on the current measurements performed by said current measuring equipment.

What is claimed is:

1. A method for locating a fault point (F) on a high-voltage three-phase AC cable (1) comprising a first end (10), a second end (11), and at least one main section (MP$_1$, MP$_2$, MP$_3$) extending between said ends (10, 11), the cable (1) comprising one conductor (R, S, T) per phase and three shields (S$_A$, S$_B$, S$_C$; S$_R$, S$_S$, S$_T$) associated with said conductors (R, S, T), said shields (S$_A$, S$_B$, S$_C$; S$_R$, S$_S$, S$_T$) being attached to one another and connected to ground (G) at both ends of each main section (MP$_1$, MP$_2$, MP$_3$), the method comprising:

measuring the conductor current ($I_{R1}$, $I_{S1}$, $I_{T1}$, $I_{R2}$, $I_{S2}$, $I_{T2}$) circulating through each conductor (R, S, T) both at the first end (10) and at the second end (11) of the cable (1);

measuring the shield current ($I_{SA1}$, $I_{SB1}$, $I_{SC1}$, $I_{SA2}$, $I_{SB2}$, $I_{SC2}$, $I_{SA3}$, $I_{SB3}$, $I_{SC3}$, $I_{SA4}$, $I_{SB4}$, $I_{SC4}$; $I_{SR1}$, $I_{SS1}$, $I_{ST1}$; $I_{SR2}$, $I_{SS2}$, $I_{ST2}$) in the vicinity of connection points to ground (G) of the shields (S$_A$, S$_B$, S$_C$);

determining the conductor (R, S, T) in fault based on the previously measured conductor currents ($I_{R1}$, $I_{S1}$, $I_{T1}$, $I_{R2}$, $I_{S2}$, $I_{T2}$);

in the event that the cable (1) comprises more than one main section (MP$_1$, MP$_2$, MP$_3$), determining the main section (MP$_1$, MP$_2$, MP$_3$) in fault based on the previously measured shield currents ($I_{SA1}$, $I_{SB1}$, $I_{SC1}$, $I_{SA2}$, $I_{SB2}$, $I_{SC2}$, $I_{SA3}$, $I_{SB3}$, $I_{SC3}$, $I_{SA4}$, $I_{SB4}$, $I_{SC4}$; $I_{SR1}$, $I_{SS1}$, $I_{ST1}$; $I_{SR2}$, $I_{SS2}$, $I_{ST2}$); and locating the fault point (F) by means of a model of the shields (S$_A$, S$_B$, S$_C$; S$_R$, S$_S$, S$_T$) of the main section (MP$_1$, MP$_2$, MP$_3$) in fault, taking into account that the shields (S$_A$, S$_B$, S$_C$; S$_R$, S$_S$, S$_T$) are attached to one another at the ends of said main part (MP$_1$, MP$_2$, MP$_3$) in fault such that three closed nets in which the sum of voltages is zero are formed in the model, the only unknown being the distance (x) to the fault point (F).

2. The method according to claim 1, wherein for determining the conductor (R, S, T) in fault, the conductor current ($I_{R1}$; $I_{S1}$; $I_{T1}$) measured at the first end (10) of the cable (1) for each conductor (R, S, T) is compared with the conductor current ($I_{R2}$; $I_{S2}$; $I_{T2}$) measured at the second end (11) of the cable (1), determining that the conductor (R, S, T) in fault will be the conductor in which the conductor current ($I_{R1}$, $I_{R2}$; $I_{S1}$, $I_{S2}$; $I_{T1}$, $I_{T2}$) at said ends (10, 11) is different.

3. The method according to claim 1, wherein the cable (1) comprises at least two main sections (MP$_1$, MP$_2$, MP$_3$), the main section (MP$_1$, MP$_2$, MP$_3$) in fault being determined taking into account that at the ends of said main section (MP$_1$, MP$_2$, MP$_3$) in fault the shield currents ($I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$) are not in phase.

4. The method according to claim 2, wherein the cable (1) comprises at least two main sections (MP$_1$, MP$_2$, MP$_3$), the main section (MP$_1$, MP$_2$, MP$_3$) in fault being determined taking into account that at the ends of said main section (MP$_1$, MP$_2$, MP$_3$) in fault the shield currents ($I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$) are not in phase.

5. The method according to claim 3, wherein for determining the main section ($MP_1$, $MP_2$, $MP_3$) in fault the shield currents ($I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$) are successively analyzed starting from one of the ends (10, 11) of the cable (1) until observing that the shield currents ($I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$) are not in phase, determining that the main section ($MP_1$, $MP_2$, $MP_3$) in fault will be the main section ($MP_1$, $MP_2$, $MP_3$) after the connection point to ground (G) in which it is detected that said shield currents ($I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$) are not in phase.

6. The method according to claim 4, wherein for determining the main section ($MP_1$, $MP_2$, $MP_3$) in fault the shield currents ($I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$) are successively analyzed starting from one of the ends (10, 11) of the cable (1) until observing that the shield currents ($I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$) are not in phase, determining that the main section ($MP_1$, $MP_2$, $MP_3$) in fault will be the main section ($MP_1$, $MP_2$, $MP_3$) after the connection point to ground (G) in which it is detected that said shield currents ($I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$) are not in phase.

7. The method according to claim 1, wherein the cable (1) has a cross bonding configuration, each main section ($MP_1$, $MP_2$, $MP_3$) comprising three minor sections ($mp_1$, $mp_2$, $mp_3$), the method comprising determining the minor section ($mp_1$, $mp_2$, $mp_3$) in fault once the main section ($MP_1$, $MP_2$, $MP_3$) in fault has been determined, wherein for determining the minor section ($mp_1$, $mp_2$, $mp_3$) in fault, first the shield ($S_A$, $S_B$, $S_C$) in fault is determined by comparing for each shield ($S_A$, $S_B$, $S_C$) the shield current ($I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$) measured at one of the ends of the main part ($MP_1$, $MP_2$, $MP_3$) in fault with the shield current ($I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$) measured at the other end of the main part ($MP_1$, $MP_2$, $MP_3$) in fault, the shield ($S_A$, $S_B$, $S_C$) in fault being the shield ($S_A$, $S_B$, $S_C$) whose current ($I_{SA1}$, $I_{SB1}$, $I_{SC1}$; $I_{SA2}$, $I_{SB2}$, $I_{SC2}$; $I_{SA3}$, $I_{SB3}$, $I_{SC3}$; $I_{SA4}$, $I_{SB4}$, $I_{SC4}$) at both ends of the main section ($MP_1$, $MP_2$, $MP_3$) in fault is different, and the minor section ($mp_1$, $mp_2$, $mp_3$) in fault being the minor section ($mp_1$, $mp_2$, $mp_3$) in which the conductor (R, S, T) in fault and the shield ($S_A$, $S_B$, $S_C$) in fault coincide.

8. The method according to claim 7, wherein the model of the shields ($S_A$, $S_B$, $S_C$) of the main section ($MP_1$, $MP_2$, $MP_3$) in fault of each shield ($S_A$, $S_B$, $S_C$) comprises per minor section ($mp_1$, $mp_2$, $mp_3$) its own resistance ($R_{SA}$, $R_{SB}$, $R_{SC}$) and its own self-inductance ($L_{SA}$, $L_{SB}$, $L_{SC}$) of the corresponding shield ($S_A$, $S_B$, $S_C$), the mutual inductance ($M_{SB-SA}$, $M_{PSC-SA}$; $M_{SA-SB}$, $M_{PSC-SB}$; $M_{PSA-SC}$, $M_{PSB-SC}$) between said shield ($S_A$, $S_B$, $S_C$) and the rest of the shields ($S_A$, $S_B$, $S_C$), and the mutual inductance ($M_{R-SA}$, $M_{S-SA}$, $M_{T-SA}$; $M_{R-SB}$, $M_{S-SB}$, $M_{PT-SC}$; $M_{PR-SC}$, $M_{PS-SC}$, $M_{PT-SC}$) between said shield ($S_A$, $S_B$, $S_C$) and the conductors (R, S, T).

9. The method according to claim 8, wherein the location of the fault point (F) is calculated by means of the following equations:

$$V_{SF}=V_{SNF}$$

$$V_{SF}=V_{SF\_mpf}+V_{SF\_mpnf1}+V_{SF\_mpnf2}$$

$$V_{SF_{mpf}}=xI_{SF1}R_{SF_{mpf}}+xjwI_{SF1}L_{SF_{mpf}}+xjwI_{CF1}M_{CF-SF_{mpf}}+$$
$$xjwI_{CNF1}M_{CNF1-SF_{mpf}}+xjwI_{CNF2}M_{CNF2-SF_{mpf}}+$$
$$xjwI_{SNF1}M_{SNF1-SF_{mpf}}+xjwI_{SNF2}M_{SNF2-SF_{mpf}}-(1-x)$$
$$I_{SF2}R_{SF_{mpf}}-(1-x)jwI_{SF2}L_{SF_{mpf}}-(1-x)jwI_{CF2}$$
$$M_{CF-SF_{mpf}}+(1-x)jwI_{CNF1}M_{CNF1-SF_{mpf}}+(1-x)$$
$$jwI_{CNF2}M_{CNF2-SF_{mpf}}+(1-x)jwI_{SNF1}M_{SNF1-SF_{mpf}}+$$
$$(1-x)jwI_{SNF2}M_{SNF2-SF_{mpf}}$$

$$V_{SF_{mpf}}=I_{SF}R_{SF_{mpf}}+jwI_{SF}L_{SF_{mpf}}+jwI_{CF}M_{CF-SF_{mpf}}+$$
$$jwI_{CNF1}M_{CNF1-SF_{mpf}}+jwI_{CNF2}M_{CNF2-SF_{mpf}}+$$
$$jwI_{SNF1}M_{SNF1-SF_{mpf}}+jwI_{SNF2}M_{SNF2-SF_{mpf}}$$

$$V_{SNF}=V_{SNF\_mpf}+V_{SNF\_mpnf1}+V_{SNF\_mpnf2}$$

$$V_{SNF_{mpf}}=xI_{SNF}R_{SNF_{mpf}}+xjwI_{SNF}L_{SNF_{mpf}}+xjwI_{CF1}$$
$$M_{CF-SNF_{mpf}}+xjwI_{CNF1}M_{CNF1-SNF_{mpf}}+$$
$$xjwI_{CNF2}M_{CNF2-SNF_{mpf}}+xjwI_{SF1}M_{SF-SNF_{mpf}}+$$
$$xjwI_{SNF2}M_{SNF2-SNF_{mpf}}+(1-x)I_{SNF}R_{SNF_{mpf}}+(1-x)$$
$$jwI_{SNF}L_{SNF_{mpf}}-(1-x)jwI_{CF2}M_{CF-SNF_{mpf}}+(1-X)$$
$$jwI_{CNF1}M_{CNF1-SNF_{mpf}}+(1-X)jwI_{CNF2}$$
$$M_{CNF2-SNF_{mpf}}-(1-X)jwI_{SF2}M_{SF-SNF_{mpf}}+(1-X)$$
$$jwI_{SNF2}M_{SNF2-SNF_{mpf}}$$

$$V_{SNF_{mpnf}}=I_{SNF}R_{SNF_{mpnf}}+jwI_{SNF}L_{SNF_{mpnf}}+jwI_{CF}$$
$$M_{CF-SNF_{mpnf}}+jwI_{CNF1}M_{CNF1-SNF_{mpnf}}+$$
$$jwI_{CNF2}M_{CNF2-SNF_{mpnf}}+jwI_{SF}M_{SF-SNF_{mpnf}}+$$
$$jwI_{SNF2}M_{SNF2-SNF_{mpnf}}$$

wherein

SF=shield in fault,

SNF=shield that is not in fault,

SNF1=one of the shields that is not in fault,

SNF2=the other shield that is not in fault,

CNF1=one of the conductors that is not in fault,

CNF2=the other conductor that is not in fault, mpf=the minor section in fault, mpnf=minor section which is not in fault, $I_{SF1}$=the current of the shield in fault on one side of the fault point, $I_{SF2}$=the current of the shield in fault on the other side of the fault point, $I_{SF}$=the current circulating through the shield in fault in the section in fault, if the current flows from the first end to the second end, it will be considered positive; in contrast, if it flows from the second end to the first end, it will be considered negative, $I_{CF}$=the current circulating through the conductor in fault; if the current flows from the first end to the second end, it will be considered positive; in contrast, if it flows from the second end to the first end, it will be considered negative, $I_{CF1}$=the current of the conductor in fault on one side of the fault point, and $I_{CF2}$=the current of the conductor in fault on the other side of the fault point.

10. The method according to claim 1, wherein the cable (1) has a solid bonded configuration such that it comprises a single main section ($MP_1$), the model of the shields ($S_R$, $S_S$, $S_T$) of each shield ($S_R$, $S_S$, $S_T$) comprising its own resistance ($R_{SR}$, $R_{SS}$, $R_{ST}$) and self-inductance ($L_{SR}$, $L_{SS}$, $L_{ST}$), the mutual inductance ($M_{SS-SR}$, $M_{ST-SR}$; $M_{SR-SS}$, $M_{ST-SS}$; $M_{SR-ST}$, $M_{SS-ST}$) between said shield ($S_R$, $S_S$, $S_T$) and the rest of the shields ($S_R$, $S_S$, $S_T$), and the mutual inductance ($M_{R-SR}$, $M_{S-SR}$, $M_{T-SR}$; $M_{R-SS}$, $M_{S-SS}$, $M_{T-SS}$; $M_{R-ST}$, $M_{S-ST}$, $M_{T-ST}$) between said shield ($S_R$, $S_S$, $S_T$) and the conductors (R, S, T).

11. The method according to claim 2, wherein the cable (1) has a solid bonded configuration such that it comprises a single main section ($MP_1$), the model of the shields ($S_R$, $S_S$, $S_T$) of each shield ($S_R$, $S_S$, $S_T$) comprising its own resistance ($R_{SR}$, $R_{SS}$, $R_{ST}$) and self-inductance ($L_{SR}$, $L_{SS}$, $L_{ST}$), the mutual inductance ($M_{SS-SR}$, $M_{ST-SR}$; $M_{SR-SS}$, $M_{ST-SS}$; $M_{SR-ST}$, $M_{SS-ST}$) between said shield ($S_R$, $S_S$, $S_T$) and the rest of the shields ($S_R$, $S_S$, $S_T$), and the mutual inductance ($M_{R-SR}$, $M_{S-SR}$, $M_{T-SR}$; $M_{R-SS}$, $M_{S-SS}$, $M_{T-SS}$; $M_{R-ST}$, $M_{S-ST}$, $M_{T-ST}$) between said shield ($S_R$, $S_S$, $S_T$) and the conductors (R, S, T).

12. The method according to claim 10, wherein the location of the fault point (F) is calculated by means of the following equations:

$$V_{SF} = V_{SNF}$$

$$V_{SF} = xI_{SF1}R_{SF} + xjwI_{SF1}L_{SF} + xjwI_{CF1}M_{CF\text{-}SF} +$$
$$xjwI_{CNF1}M_{CNF1\text{-}SF} + xjwI_{CNF2}M_{CNF2\text{-}SF} +$$
$$xjwI_{SNF1}M_{SNF1\text{-}SF} + xjwI_{SNF2}M_{SNF2\text{-}SF} - (1-x)$$
$$I_{SF2}R_{SF} - (1-x)jwI_{SF2}L_{SF} - (1-x)jwI_{CF2}M_{CF\text{-}SF} +$$
$$(1-x)jwI_{CNF1}M_{CNF1\text{-}SF} + (1-x)jwI_{CNF2}M_{CNF2\text{-}SF} +$$
$$(1-x)jwI_{SNF1}M_{SNF1\text{-}SF} + (1-x)jwI_{SNF2}M_{SNF2\text{-}SF}$$

$$V_{SNF} = xI_{SNF}R_{SNF} + xjwI_{SNF}L_{SNF} + xjwI_{CF1}M_{CF\text{-}SNF} +$$
$$xjwI_{CNF1}M_{CNF1\text{-}SNF} + xjwI_{CNF2}M_{CNF2\text{-}SNF} +$$
$$xjwI_{SF1}M_{SF\text{-}SNF} + xjwI_{SNF2}M_{SNF2\text{-}SNF} + (1-x)I_{SNF}R_{SNF} + (1-x)jwI_{SNF}L_{SNF} - (1-x)jwI_{CF2}M_{CF\text{-}SNF} +$$
$$(1-x)jwI_{CNF1}M_{CNF1\text{-}SNF} + (1-x)jwI_{CNF2}$$
$$M_{CNF2\text{-}SNF} - (1-x)jwI_{SF2}M_{SF\text{-}SNF} + (1-)$$
$$xjwI_{SNF2}M_{SNF2\text{-}SNF}$$

wherein
SF=shield in fault,
SNF=shield that is not in fault,
SNF1=one of the shields that is not in fault,
SNF2=the other shield that is not in fault,
CF=conductor in fault,
CNF1=one of the conductors that is not in fault,
CNF2=the other conductor that is not in fault,
$I_{SF1}$=the current of the shield in fault on one side of the fault point,
$I_{SF2}$=the current of the shield in fault on the other side of the fault point,
$I_{CF1}$=the current of the conductor in fault on one side of the fault point, and
$I_{CF2}$=the current of the conductor in fault on the other side of the fault point.

13. The method according to claim 11, wherein the location of the fault point (F) is calculated by means of the following equations:

$$V_{SF} = V_{SNF}$$

$$V_{SF} = xI_{SF1}R_{SF} + xjwI_{SF1}L_{SF} + xjwI_{CF1}M_{CF\text{-}SF} +$$
$$xjwI_{CNF1}M_{CNF1\text{-}SF} + xjwI_{CNF2}M_{CNF2\text{-}SF} +$$
$$xjwI_{SNF1}M_{SNF1\text{-}SF} + xjwI_{SNF2}M_{SNF2\text{-}SF} - (1-x)$$
$$I_{SF2}R_{SF} - (1-x)jwI_{SF2}L_{SF} - (1-x)jwI_{CF2}M_{CF\text{-}SF} +$$
$$(1-x)jwI_{CNF1}M_{CNF1\text{-}SF} + (1-x)jwI_{CNF2}M_{CNF2\text{-}SF} +$$
$$(1-x)jwI_{SNF1}M_{SNF1\text{-}SF} + (1-x)jwI_{SNF2}M_{SNF2\text{-}SF}$$

$$V_{SNF} = xI_{SNF}R_{SNF} + xjwI_{SNF}L_{SNF} + xjwI_{CF1}M_{CF\text{-}SNF} +$$
$$xjwI_{CNF1}M_{CNF1\text{-}SNF} + xjwI_{CNF2}M_{CNF2\text{-}SNF} +$$
$$xjwI_{SF1}M_{SF\text{-}SNF} + xjwI_{SNF2}M_{SNF2\text{-}SNF} + (1-x)$$
$$I_{SNF}R_{SNF} + (1-x)jwI_{SNF}L_{SNF} - (1-x)jwI_{CF2}$$
$$M_{CF\text{-}SNF} + (1-x)jwI_{CNF1}M_{CNF1\text{-}SNF} + (1-x)$$
$$jwI_{CNF2}M_{CNF2\text{-}SNF} - (1-x)jwI_{SF2}M_{SF\text{-}SNF} + (1-)$$
$$xjwI_{SNF2}M_{SNF2\text{-}SNF}$$

wherein
SF=shield in fault,
SNF=shield that is not in fault,
SNF1=one of the shields that is not in fault,
SNF2=the other shield that is not in fault,
CF=conductor in fault,
CNF1=one of the conductors that is not in fault,
CNF2=the other conductor that is not in fault,
$I_{SF1}$=the current of the shield in fault on one side of the fault point,
$I_{SF2}$=the current of the shield in fault on the other side of the fault point,
$I_{CF1}$=the current of the conductor in fault on one side of the fault point, and
$I_{CF2}$=the current of the conductor in fault on the other side of the fault point.

14. A system for locating a fault point (F) in a high-voltage three-phase AC cable (1) comprising a first end (10), a second end (11), and at least one main section ($MP_1$, $MP_2$, $MP_3$) extending between said ends (10, 11), the cable (1) comprising one conductor (R, S, T) per phase and three shields ($S_A$, $S_B$, $S_C$; $S_R$, $S_S$, $S_T$) associated with said conductors (R, S, T), said shields ($S_A$, $S_B$, $S_C$; $S_R$, $S_S$, $S_T$) being attached to one another and connected to ground (G) at both ends of each main section ($MP_1$, $MP_2$, $MP_3$), the system comprising:
- a first current measuring equipment configured for measuring the current of conductor ($I_{R1}$, $I_{S1}$, $I_{T1}$, $I_{R2}$, $I_{S2}$, $I_{T2}$) circulating through each conductor (R, S, T) both at the first end (10) and at the second end (11) of the cable (1);
- a second current measuring equipment configured for measuring the shield current ($I_{SA1}$, $I_{SB1}$, $I_{SC1}$, $I_{SA2}$, $I_{SB2}$, $I_{SC2}$, $I_{SA3}$, $I_{SB3}$, $I_{SC3}$, $I_{SA4}$, $I_{SB4}$, $I_{SC4}$; $I_{SR1}$, $I_{SS1}$, $I_{ST1}$; $I_{SR2}$, $I_{SS2}$, $I_{ST2}$) in the vicinity of the connection points to ground (G) of the shields ($S_A$, $S_B$, $S_C$), and
- a computer configured for executing the method according to claim 1 based on the current measurements performed by said current measuring equipment.

* * * * *